(12) United States Patent
Uzunoglu

(10) Patent No.: US 6,667,666 B2
(45) Date of Patent: Dec. 23, 2003

(54) SYNCHRONOUS OSCILLATORS

(75) Inventor: Vasil Uzunoglu, Athens (GR)

(73) Assignee: Anthony Aeschlimann, Geneva (CH)

( * ) Notice: Subject to any disclaimer, the term of this patent is extended or adjusted under 35 U.S.C. 154(b) by 0 days.

(21) Appl. No.: 10/235,394

(22) Filed: Sep. 5, 2002

(65) Prior Publication Data

US 2003/0011438 A1 Jan. 16, 2003

Related U.S. Application Data

(63) Continuation of application No. 10/117,786, filed on Apr. 5, 2002, which is a continuation of application No. PCT/IB00/01447, filed on Oct. 9, 2000, now abandoned.
(60) Provisional application No. 60/158,031, filed on Oct. 7, 1999.

(51) Int. Cl.[7] .............................. H03B 5/08; H03B 5/12
(52) U.S. Cl. ................... 331/173; 331/117 R; 331/175
(58) Field of Search ..................... 331/117 R, 117 FE, 331/117 D, 169–171, 172, 173, 175

(56) References Cited

U.S. PATENT DOCUMENTS 3,882,422 A * 5/1975 Freed ..................... 331/116 R
6,437,652 B1 * 8/2002 Gomez ................. 331/116 FE

* cited by examiner

*Primary Examiner*—David C. Mis
(74) *Attorney, Agent, or Firm*—Christopher P. Maiorana, P.C.

(57) ABSTRACT

A modification of the synchronous oscillator is described, having regenerative positive feedback. The circuit includes an amplifier, a high-Q tank circuit, and a conventional synchronous oscillator feedback network. An additional feedback path provides a negative impedance conversion effect.

20 Claims, 24 Drawing Sheets

Tank Circuit Q and Gm
Producing the Gain-Synchronization Curve

SYNCHRONOUS OSCILLATORS

This is a continuation of UK application No. 0208034.9, filed on Apr. 8, 2002 and U.S. application Ser. No. 10/117,786, filed Apr. 5, 2002, which is a continuation of International Application PCT/IB00/01447, with an international filing date of Oct. 9, 2000 (Oct. 9, 2000), published in English under PCT Article 21(2) and now abandoned which claims the benefit of No. 60/158,031 filed Oct. 7, 1999.

FIELD OF THE INVENTION

This invention relates to the field of synchronous oscillators. Such oscillators are used as building blocks in a wide variety of circuit applications, including (but not limited to) clock recovery, modulation, encoding, decoding, signal detectors and discriminators, and direct sequence, spread spectrum (DSSS) systems. It is also ideal for broadband communications, in AM to FM conversion, FM to digital conversion, etc.

BACKGROUND TO THE INVENTION

The synchronous oscillator is well known, and is described, for example, in U.S. Pat. Nos. 4,274,067, 4,335,404 and 4,356,456 as well as in numerous papers published by the present inventor.

The basic building blocks for a synchronous oscillator are shown, for example, in FIG. 1, and consist of an amplifier 10, a high-Q tank circuit 12, and a positive feedback path 14 through a feedback capacitor 16, and a second feedback path 18.

The circuit uses regeneration to provide an output which is regeneratively linked to the input signal. By a combination of positive and negative feedback, the input signal sensitivity and the regeneration gain are inversely proportional to the input signal.

The synchronous oscillator has a natural resonant frequency at which oscillation occurs in the absence of an input signal. However, when an input signal is applied, the oscillator very quickly "tunes" to match the input signal. This occurs by regenerative gain of the input signal; when the amplitude of the regenerated signal exceeds the amplitude of the natural oscillations, then the natural oscillations are replaced by the regenerating signal, which is the input signal multiplied by the regeneration gain.

An example of a conventional synchronous oscillator circuit is illustrated at 20 in FIG. 2. An input transistor receives an input signal (Vi) at its base. The collector of the input transistor T1 is coupled to the emitter of an oscillator transistor T2. The input transistor T1 acts as an input buffer amplifier for the input signal, and injects the input signal into the oscillator transistor T2.

The collector of the oscillator transistor T2 is coupled to one end of an inductor L of a tank circuit 22. The tank circuit 22 comprises the inductor L coupled in parallel with series connected capacitors C2 and C3. The other end of the inductor L is coupled through a second inductor Lc to the positive supply rail Ve.

The synchronous oscillator also includes first and second feedback paths 24 and 26. The first feedback path 24 is provided by a feedback capacitor C1 coupled between the tank circuit 22 and the base of the oscillator transistor T2. This provides positive feedback from the tank circuit 22 to the input of the oscillator transistor T2, to provide regenerative feedback in the circuit. The second inductor Lc acts as a choke to provide a buffer for the power supply, and also forces the feedback though the feedback capacitor C1 to the base of the oscillator transistor T2. Feedback to the transistor is positive to enhance oscillations.

The second feedback path 26 is provided by a connection from the emitter of the oscillator transistor T2 to a node 28 between the series connected capacitors C2 and C3 of the tank circuit 22.

The transistors T1 and T2 are biased by respective resistors R1 and R2 coupled to the positive supply rail Ve.

The output from the circuit may be taken at any suitable point driven by the oscillator transistor T2. In the illustrated circuit the output is taken from the second feedback path 26, coupled by a D.C. blocking output capacitor Co.

The main regenerative feedback in the circuit is that provided by the first feedback path 24 through the feedback capacitor C1. However, this is believed not to be continuous positive feedback, but instead occurs in samples or bursts (depicted schematically at 30), due to class "C" operation of the oscillator transistor T2.

Certain selected characteristics of the synchronous oscillator 20 are illustrated in FIGS. 3 and 4.

FIG. 3 shows the relation between the regenerative gain $g_m$ of the oscillator, and the Q of the tank circuit, with varying frequency. The maximum Q occurs at the resonant frequency $\omega_0$. However this also corresponds to the minimum amount of regenerative gain. As the Q decreases, the regenerative gain increases. The product of the two represents the overall gain of the circuit. Therefore, it can be seen that the gain has an extremely wide, and flat, characteristic, representing a linear response over a very broad bandwidth. Such a characteristic is highly advantageous in broadband communications.

In FIG. 3, the frequency response drops sharply at the edges of the bandwidth. This is a result of the signal becoming so small that it cannot compensate for losses in the tank circuit.

The output of the standard synchronous oscillator varies in phase from +90° to −90° with respect to the input, across the bandwidth of the oscillator. The zero phase difference occurs when the input signal corresponds to the resonant frequency $\omega_0$ (see FIG. 3).

To illustrate the high sensitivity and high noise rejection of the circuit, FIG. 4a depicts an input signal which is affected by noise, for discrimination. The input signal is represented by low amplitude input signal 32 which is barely distinguishable from surrounding noise 34. When fed as an input to the synchronous oscillator 20 of FIG. 2, the oscillations rapidly "tune" to the frequency of the input signal 32, to provide a strongly discriminated output 36, as shown in FIG. 4b.

FIG. 5 illustrates a second example of a conventional circuit, in the form of a coherent phase synchronous oscillator circuit. This is similar to the circuit of FIG. 3, but a phase detector 38 is included to detect the phase difference between the input signal and the output signal. The output from the phase detector 38 is fed through an integrator 39 to provide a phase control input to the oscillator transistor T2 of the synchronous oscillator. In this way, the phase of the output signal can be made identical to that of the input signal to provide a coherent phase output (in contrast to the variable phase characteristic of the circuit shown in FIG. 3).

However, compared to other circuits, a synchronous oscillator can provide a wide bandwidth, a high input sensitivity and a high noise rejection, which seems not to be matched by other circuits. A good PLL may, for example, have a signal sensitivity of about −25 dBm and a signal to noise ratio sensitivity of +3 dBm. In contrast, a synchronous oscillator may provide a signal sensitivity of −100 dBm and an input signal to noise ratio sensitivity as low as −38 dB.

A further important characteristic of the synchronous oscillator is its energy efficiency. The regenerative feedback results in very little power dissipation, enabling the circuit to operate highly effectively with very low power supply requirements, for example, approximately 2–3 volts.

As explained above, in the conventional synchronous oscillator, the output "tunes" to the same frequency as the input signal.

SUMMARY OF THE INVENTION

It would be desirable to yet further improve the characteristics of a synchronous oscillator.

Broadly speaking, a first aspect of the present invention provides a synchronous oscillator comprising a feedback path which provides negative impedance conversion (NIC).

A second broad aspect of the invention relates to a synchronous oscillator with an additional feedback path from an output node of an amplifier to an input node. The additional feedback path may include or have one or more of the following:

(a) a resonant frequency at least ten times lower than that of a tank circuit of the oscillator;

(b) a resonant frequency at least ten times lower than a fundamental frequency of the oscillator;

(c) a capacitance (or a capacitance component) having a value at least ten times larger than a characteristic capacitance of the tank circuit;

(d) an inductance (or an inductive component) having a value at least ten times larger than a characteristic inductance of the tank circuit;

(e) a purely capacitive, non-inductive, complex impedance.

The combination of such a feedback path and the normal regenerative feedback may provide additional benefits. Advantages, features and objects of the invention include one or more of:

The bandwidth of the circuit may be increased;

The input sensitivity of the circuit may be increased;

The noise rejection sensitivity of the circuit may be improved;

The frequency stability of the circuit may be increased; and

The jitter rejection may be improved.

In addition to the effects listed above (wider bandwidth, better jitter and noise rejection and better frequency stabilisation), a further effect of NIC feedback may be to enable the frequency of oscillation to be increased. Instead of the output being the same frequency as the input, the output can be a harmonic of the input frequency, and the oscillator will synchronise to a harmonic of the input frequency or the fundamental frequency. The desired harmonic may be selected by the design of the circuit.

The invention may be better understood from the following description with reference to the accompanying drawings. In addition, further broad definitions of the invention and technical descriptions are provided in Annex A appended hereto and explicitly forming part of the content and description of this application.

DESCRIPTION OF THE DRAWINGS

Embodiments of the invention are now described, by way of example only, with reference to the accompanying drawings, in which:

FIG. 4a is a schematic representation of a noisy input signal, and FIG. 4b shows the corresponding discriminated output signal;

DESCRIPTION OF PREFERRED EMBODIMENTS

In the following description, like numerals are used to indicate features equivalent to those described previously with respect to FIGS. 1–5.

Figure 6:
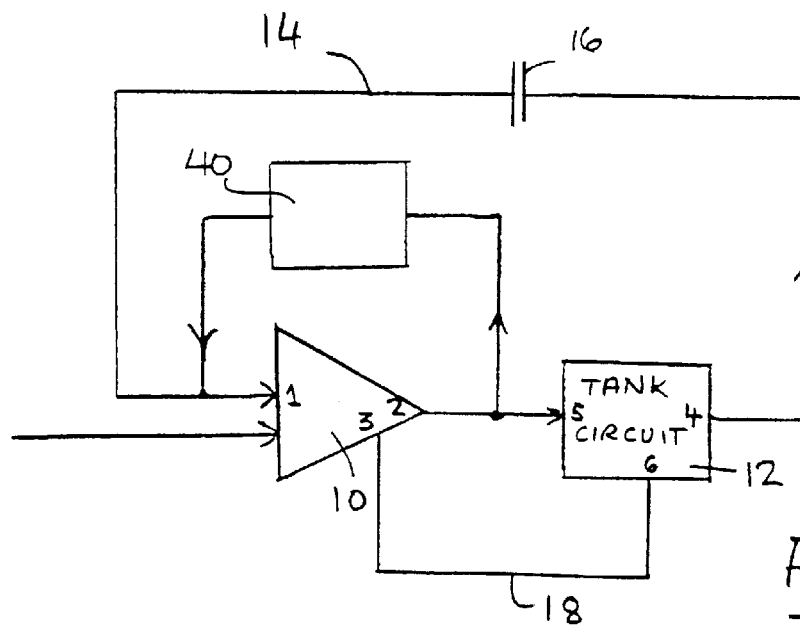
FIG. 6 is a schematic block diagram showing the building blocks of a synchronous oscillator with negative impedance conversion.

FIG. 6 illustrates an example of a modified circuit in which a third feedback path 40 is added to the input of the oscillator amplifier 10 in the synchronous oscillator circuit. The third feedback path provides a complex impedance. (In FIG. 6 example nodes of the circuit referred to later are identified by numerals 1–6).

The third feedback path may provide an effect referred to herein as negative impedance conversion (NIC). The principle of NIC might be neither strict positive feedback, nor strict negative feedback. The third feedback path may be referred to as negative, using traditional circuit nomenclature for such an individual feedback path, but negative feedback might not correctly define the feedback operation, not might it predict enhanced circuit performance (explained below). The feedback may be at least partially positive, but it might not be strict positive feedback. Instead, it may be the summation of all feedbacks in the circuit which makes the whole circuit work. There is no analysis of this type of circuit anywhere, because no feedback analysis has been performed on oscillators with more than one feedback path. For nomenclature, the feedback used for NIC is identified as negative, because, if the first feedback path were removed such that the circuit did not oscillate, the feedback effect of the third feedback path may be negative.

Such a third feedback path in combination with the regenerative feedback of the synchronous oscillator may provide unpredicted and surprisingly advantageous effects. In particular, compared to a synchronous oscillator without NIC:

The bandwidth of the circuit may be increased;

The input sensitivity of the circuit may be increased;

The noise rejection sensitivity of the circuit may be improved;

The frequency stability of the circuit may be increased; and

The jitter rejection may be improved.

The increase in any of the above may be up to about 30% or, in some cases, even greater.

Such characteristics may normally be associated with an increase in the regenerative gain of the oscillator circuit. Therefore, the effect of the feedback path in combination with the conventional regenerative feedback may be to pump more energy to the input of the oscillator amplifier, thereby producing the increase in regenerative gain. For this reason, the feedback effect may be referred to herein as negative impedance conversion.

The circuit with NIC may also have better energy and circuit efficiency.

The circuit of FIG. 6 may generally comprise the amplifier 10, the tank circuit 12 with high Q, the first positive feedback path 14 from the tank circuit to an input of the amplifier, the first positive feedback path having a first complex impedance, and the additional (e.g., negative impedance conversion) feedback path 40 to the input of the amplifier, the additional feedback path 40 having a complex impedance, and being distinct from the first feedback path 14.

The additional feedback path 40 may include a capacitance or a capacitive component. The capacitance may be at least 10 times that of a characteristic capacitance of the tank circuit 12. The ratio may be far greater than 10, for example, 15, 20, 30, 40, 50, 60, 70, 80, 90 or 100, or more.

The additional feedback path 40 may include an inductance or an inductive component. The inductance may be at least 10 times that of a characteristic inductance of the tank circuit 12. The ratio may be far greater than 10, for example, 15, 20, 30, 40, 50, 60, 70, 80, 90 or 100 or more.

The additional feedback path 40 may define a resonant frequency characteristic. This resonant frequency may at least 10 times lower than a resonant frequency characteristic of the tank circuit 12. The magnitude of the ratio may be far greater than 10, for example, 15, 20, 30, 40, 50, 60, 70, 80, 90 or 100 or more times lower.

The additional feedback path 40 may define a resonant frequency characteristic at least 10 times lower than a fundamental frequency characteristic of the oscillator. The magnitude of the ratio may be far greater than 10, for example, 15, 20, 30, 40, 50, 60, 70, 80, 90 or 100 or more times lower.

The fundamental frequency of the oscillator may be determined by the resonant frequency of the tank circuit 12. In such case, the resonant frequency characteristic of the additional feedback path 40 may be significant removed from the fundamental frequency of the oscillator.

In addition to the effects listed above (wider bandwidth, better jitter and noise rejection and better frequency stabilisation), a further effect of NIC feedback may be to enable the frequency of oscillation to be increased, for example, compared to the fundamental frequency of the synchronous oscillator.

Instead of the output being the same frequency as the fundamental frequency, the output can be a harmonic to which the oscillator may synchronise. The desired harmonic may be selected by the design of the circuit.

The harmonic at which the circuit works may be the result of the number of transistors in the Synchronous Oscillator (SO). A one transistor circuit may operate at the second harmonic (i.e. 3 times the input frequency), while a two transistor circuit may operate at the third (i.e. ×4), fourth (i.e. ×5), or fifth harmonic (i.e. ×6).

This provides the surprising, and unpredicted, result that the output from the oscillator amplifier can be tracked at a frequency different from the fundamental frequency of the oscillator. In such a circuit, regeneration of a harmonic generated by non-linearities in the oscillator amplifier 10 may become more dominant than the original frequency, and the oscillator may then "tune" to the dominant harmonic.

In the following embodiments, frequency tracking at times four, and times three, are described compared to the fundamental frequency of the synchronous oscillator. However, the invention is not limited only to such factors of frequency, and other frequency conversions may be achieved by appropriate additional or alternative feedback paths to the input of the oscillator amplifier 10.

Figure 7:
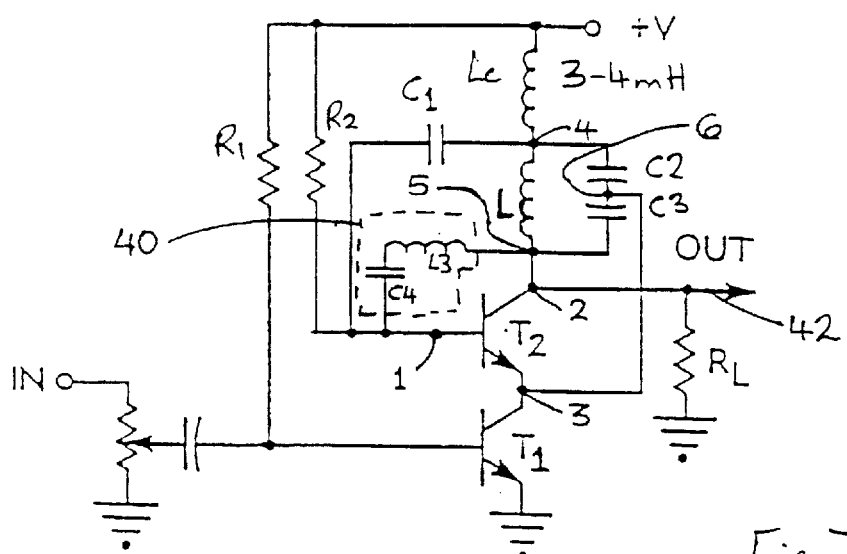
FIG. 7 is a schematic circuit diagram of a first embodiment of the invention.

FIG. 7 illustrates a second embodiment of the invention. This is similar to the synchronous oscillator shown in FIG. 2 (like numerals being used).

The circuit includes nodes 1, 2 and 3 of the oscillator transistor T2, and nodes 4, 5 and 6 of the tank circuit. Node 2 is coupled to node 5. The conventional first feedback path 24 is coupled between the input node 1 of the oscillator transistor T2 and node 4 of the tank circuit 22. The conventional second feedback path 26 is coupled between node 6 of the tank circuit 22 and node 3 of the oscillator transistor T2.

The present embodiment also comprises the third feedback path 40 coupled between node 5 of the tank circuit and node 1. The third feedback path 40 has a complex impedance and consists of a series coupled capacitor C4 and inductor L3 to provide the third feedback path 40 to the input (base) of the oscillator transistor T2. As mentioned, the third feedback path 40 originates from the collector of the oscillator transistor T2 and the tank circuit 22.

In a non-regenerative circuit, feedback between the collector and emitter of a transistor would be considered to be negative feedback. However, in the present embodiments using the third feedback path 40, it may generate powerful feedback that may create the negative impedance conversion (NIC) effect described above, between the collector and the base. The effect may be to increase the regenerative gain of the circuit.

The series coupled capacitor C4 and inductor L3 define a series resonance circuit, having a series resonant frequency which, in this example, is at least 10 times lower than the fundamental frequency characteristic of the oscillator. In this example, the fundamental frequency of the oscillator is determined by the resonant frequency of the tank circuit.

The value of C4 may be at least 10 times the combined values of C2 and C3. The combined value may be (C2+C3) or C2.C3/(C2+C3). The value of L3 may be at least 10 times the value of L. Typically, for a fundamental oscillator frequency of about 200 MHz, then C2 and C3 may each be of about 200 pF, and L may be approximately 2–5 microH. C4 may be at least 4 microF. L3 may be at least 20–50 microh.

It is believed that the additional regenerative gain may be as much as 20–30 dBm or more.

The combination of positive feedback and the negative feedback (or negative impedance conversion) may also be used to provide the further advantages of the Coherent Phase-Locked Synchronous Oscillator (CPSO).

NIC may thus enable the advantageous properties of a conventional synchronous oscillator to be enhanced even further. The following table shows a comparison between typical performance figures for a conventional synchronous oscillator (FIG. 2), and the same circuit using NIC:

|  | Conventional SO | SO with NIC |
| --- | --- | --- |
| Tracking/Bandwidth | 3 MHz | 5 MHz |
| Input Sensitivity | −100 dBm | −124 dBm |
| Noise Rejection | −38 dB | −48 dB |
| Phase Jitter | A few degrees (barely measurable) | Not measurable |

It is emphasised that the above is merely one, non-limiting, example.

An additional effect of NIC may be that of frequency conversion compared to the fundamental frequency of the oscillator. The oscillator may "tune" to a harmonic of the fundamental frequency, for example, resulting from non-linearity in the transistors, the harmonic becoming dominant by the regenerative feedback. In the circuit shown in FIG. 7 frequency multiplication by a factor of four may occur (i.e. the third harmonic is made dominant).

The circuit of FIG. 7 has successfully been tested in carrier recovery in quadrature phase shift keying (QPSK) modems and networks, for automatically converting a 140 MHz intermediate frequency (IF) signal or circuit to operate at 560 MHz. It has been used also in other areas, such as in wideband communications, in radars, etc.

Figure 8:
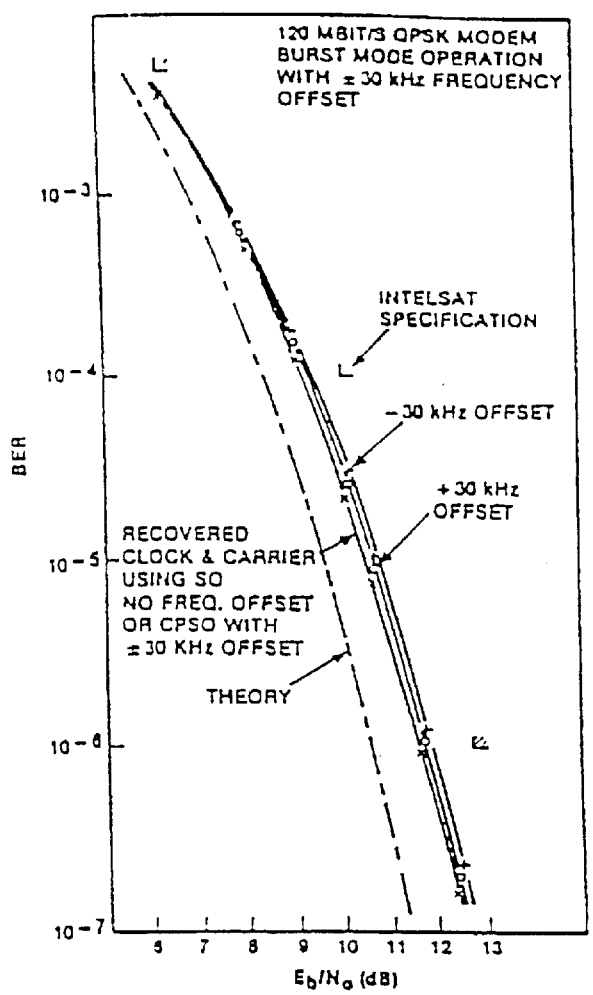
FIG. 8 is a graph showing the performance of the circuit of FIG. 7 in QPSK modems.

FIG. 8 shows the BER curves for a 120 Mbit modem using burst mode QPSK. The circuit performance is similar to back-to-back operation. The BER curves are almost on top of each other, and they are close to the theoretical optimum performance.

Figure 9:
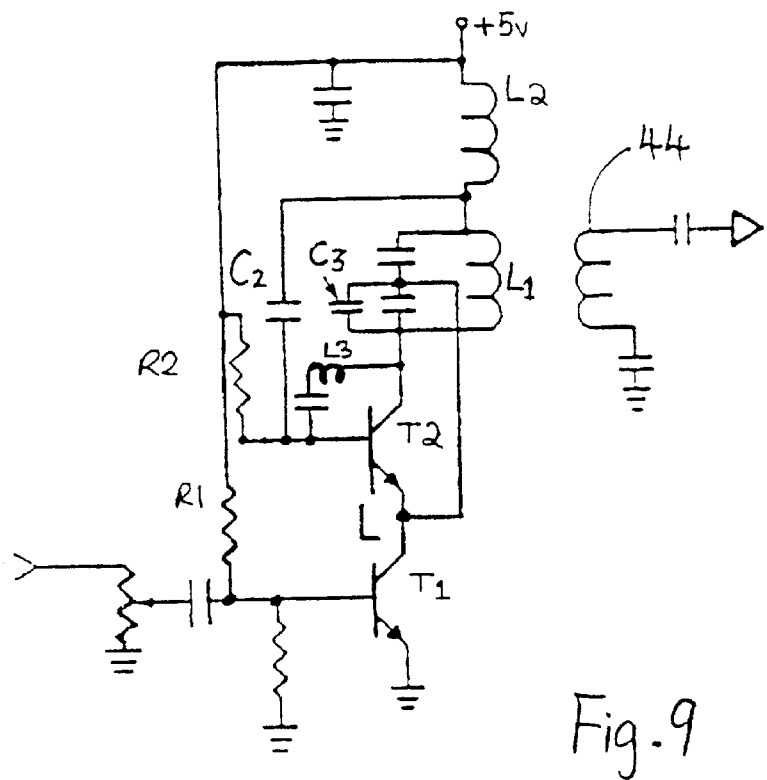
FIG. 9 is a schematic circuit diagram of a circuit similar to FIG. 7, but with an inductively coupled output.

In FIG. 7, an output 42 from the circuit is shown as being taken from the collector of the oscillator transistor T2. However, as mentioned above, other outputs may be used as desired. For example, FIG. 9 shows an equivalent circuit in which the output is taken through a secondary transformer coil 44 inductively coupled to the inductor L1 of the tank circuit 22.

Figure 10:
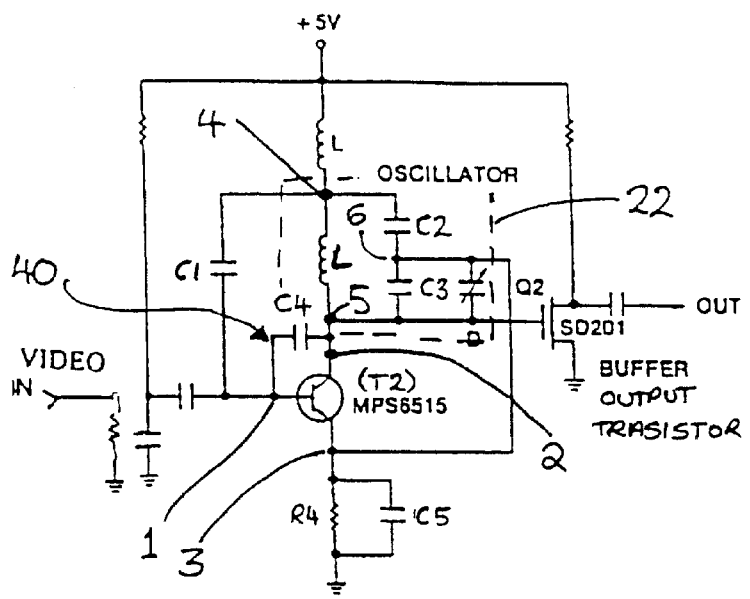
FIG. 10 is a schematic circuit diagram of a second embodiment of the invention having one transistor.

A second embodiment of the invention is shown in FIG. 10, which shows a circuit based on a single-transistor type synchronous oscillator. Such a single-transistor type synchronous oscillator circuit is similar to FIG. 2, except that the input transistor T1 is removed. Instead, the input signal is supplied directly to the base of the oscillator transistor T2. The emitter of the oscillator transistor T2 is coupled to ground through a parallel connection of a resistor R4 and a capacitor C5. The resistor R4 provides feedback for the emitter-to-tank circuit feedback, while the capacitor C5 lowers the input resistance for the input signal.

In FIG. 10, the third feedback path 40 is implemented by a capacitor C4 coupled to the input (base) of the oscillator transistor T2. The third positive feedback path 40 originates from the collector of the oscillator transistor T2 and the tank circuit 22.

The capacitor may have a value at least 10 times the value of a characteristic capacitance of the tank circuit, as discussed for the capacitance C4 of the preceding embodiment.

The circuit of FIG. 10 may provide the same performance enhancement as the preceding embodiment, namely an increase in bandwidth, improved input sensitivity, improved noise rejection, and a reduction in jitter. In the circuit of FIG. 10, frequency multiplication by a factor of three occurs (i.e. domination by the second harmonic), instead of times four as in the first embodiment.

The second embodiment is also suitable for use in QPSK modems. For example, a 48 MHz oscillator frequency can automatically be converted to around 140 MHz IF frequency.

Figure 11:
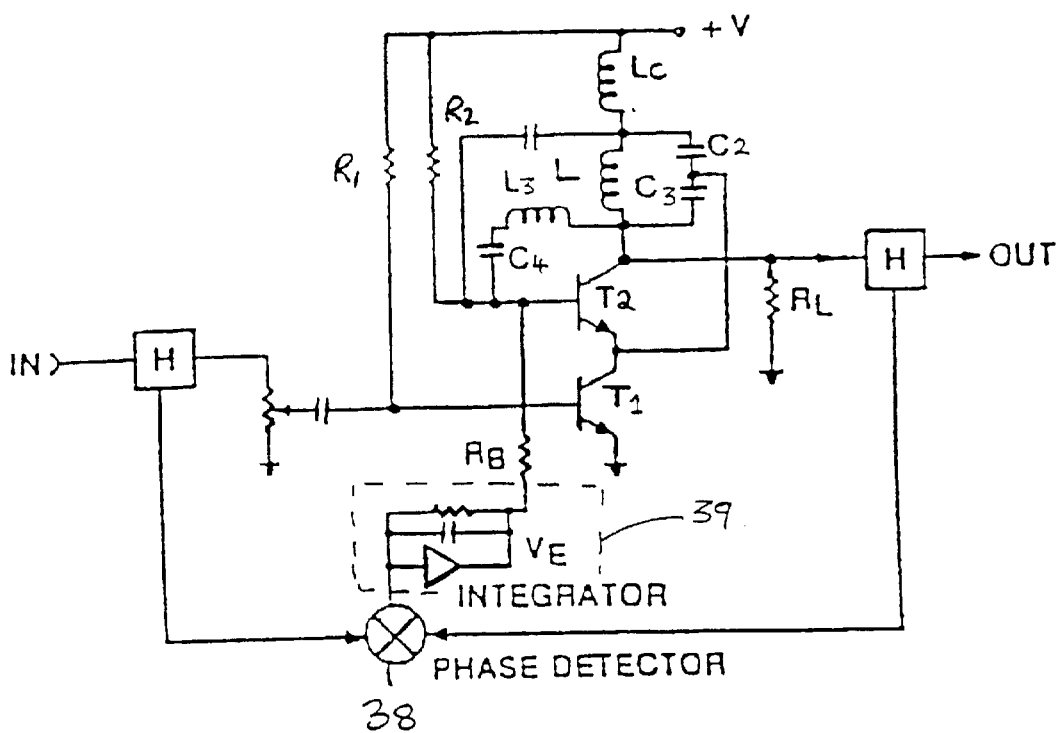
FIG. 11 is a schematic circuit diagram showing the circuit of FIG. 7 in the form of a coherent phase synchronous oscillator, having zero phase error between input and output.

In the first and second embodiments, the synchronous oscillators are not phase corrected. However, if desired, the same negative impedance conversion feedback may be used in a coherent phase synchronous oscillator. For example, FIG. 11 shows such a coherent phase oscillator similar to FIG. 5, with the addition of the third feedback path 40 employing the inductor L3 and the capacitor C4. Such a circuit may provide the same enhancement of performance resulting from NIC, but with the addition of coherent phase. In standard circuits, no phase correction is available.

The above principle of NIC can be used in transmission lines, to increase their functional properties, in frequency, tracking range, noise rejection, and also provide better frequency stability and lower phase jitter. Also, along the same lines, it can be used in integrated circuits, where by pumping energy into the network, the functional properties and frequency characteristics may be improved.

Transistors with poor frequency responses (e.g. not normally exceeding 100 MHz) may be used to operate at much higher frequencies, by promoting the third and fourth harmonics. As above, this can provide significant improvements in the circuit performance, including wider tracking ranges, higher noise rejection, improved frequency stability and lower jitter. The performance of poor quality printed circuit boards and poor quality transistors can likewise be improved where hitherto not possible.

These improvements may be attributed to a direct result of the additional negative/NIC feedback in the circuit.

The invention can find widespread application in many different types of circuit, including replacement of conventional synchronous oscillators in existing circuits. The invention is especially suitable for use in replacing PLL's at various frequencies, without such limitations on data bandwidth or noise rejection. Also, it can be used in wideband communications.

Other applications for which the invention is especially suitable include:

(a) clock recovery
(b) audio/video/digital communications, including transmitters, receivers, AM modulators, FM modulators, wideband communications,
(c) signal routers
(d) optical synchronisation circuits (for example by using an optically stimulated phototransistor. Also by using an optical emitter, an optical output can be generated).
(e) Time Division Multiple Access (TDMA), CDMA, WDMA systems.
(f) Highly sensitive detectors, for example for use in radars. A specific example is aircraft radar. When a radar beam passes through an air pocket, slight changes in the signal phase occur. It is very difficult for a conventional radar receiver to detect such a small change in the received signal. However, by using a synchronous oscillator, the change in phase may be converted to frequency modulation, which is then easily detected. This may therefore provide a very sensitive detector which in aircraft can enable air pockets to be reliably detected.

Further definitions of the invention and technical descriptions are provided in Annex A appended hereto and explicitly forming part of the content and description of this application.

It will be appreciated that the above description of embodiments of the invention is purely illustrative, and that many modifications may be made within the scope or spirit of the invention.

For example, although capacitors and inductors are shown in the embodiments, it will be appreciated that these devices may be synthesised if desired by synthesis circuits which might not themselves employ specific capacitor or inductive devices. Such synthesis circuits may, for example, be particularly suitable if the synchronous oscillator is implemented wholly or partly within an integrated circuit.

New Developments and Applications on Synchronous and Coherent Phase-Locked Synchronous Oscillators 1. Introduction In the long history of LC sinusoidal oscillators, with many papers written during the 65 years, nobody told us why a continuous positive feedback on an oscillator, did not cause self-destruction. Nobody told us, that LC oscillators did not have saturation. Nobody told us also that an oscillator can be used also as a universal signal processing network. Nobody told us that an injected oscillator can have two or more internal filters, that function independent of each other. Also, nobody told us that the regeneration gain of an injected oscillator is inversely proportional to the input signal level, so is the input signal sensitivity.

2. Fundamentals of Oscillators

The three original patents on Synchronous Oscillators (SO) [1] primarily dealt with carrier and clock recovery in BPSK and QPSK modems. In the last two decades experiments carried out on SO's and CPSO's indicate that the SO and the CPSO are universal multifunctional networks that have widespread applications in many areas of signal processing. Understanding the fundamental properties of oscillators was the key point in expending the applications. Many of these functions can not be performed by classical networks. The functions are:

A. Self-Regulation Property.

The self-regulation property replaces the saturation process in classical networks. An LC oscillator, for example, Saturation is a unidirectional property, whereas the self-regulation is expressed as

AMPLITUDE OF OSCILLATIONS×REGENERATION GAIN=CONSTANT.

This implies that when amplitude of oscillations increases the regeneration gain decreases, and vice versa, to keep the product constant. This phenomenon explains also, why an oscillator is not self-destructive. This is universal law of nature. It makes our world survive. For example, Einstein's energy law $$E/m = c^2 \qquad (1)$$

It says that E/m is self regulated by the constancy of $c^2$.

B. SO has Three Internal Filters

The three filters of a SO are:
a. The high Q tank circuit filter.
b. The data filter or the tracking range is the summation of all noise rejection or instantaneous filters.
c. The LC oscillator oscillates in class "C" mode. The positive feedback is not continuous but occurs in bursts or in samples. This is a low-pass filter. These filters function independent of each other, for all practical purposes. This unique property separates the classical networks from the SO and the CPSO. For example, in a Phase-Lock Loop (PLL) when the noise rejection of the loop is improved, the data BW deteriorates and vice versa. In a SO, the product of noise rejection and the data BW can be maximized. The SO can have a "Q"=3×10$^6$, while the SO enjoys several MHz tracking range or data BW, at the same time.

The new ideas presented here are the results of the powerful functional properties of oscillators, Synchronous Oscillators and Coherent Phase-Locked Synchronous Oscillators.

C. SO has Very High Input Signal Sensitivity

The input signal sensitivity of a SO is a function of its internal regeneration gain. Higher regeneration gain implies higher input signal sensitivity, higher noise rejection, higher data bandwidth and faster acquisition. Moreover, higher regeneration gain provides also better frequency stability and lower phase jitter, similar to crystal oscillators.

The SO and the CPSO can detect signals as low as −100 dBm and signals with noise as low as −40 dB.

D. SO Operates Similar to a Spectrum Analyzer

The high "Q" noise rejection filter corresponds to the resolution BW of the Spectrum Analyzer. The SO looks at any time to the instantaneous input frequency and its immediate surrounding frequencies to track the entire data bandwidth. Thus, summation of all noise rejection bandwidths is the data BW or tracking range.

E. SO is a Direct Audio to FM and Video to FM Converter

Any audio or video applied to the input of the SO is converted directly to FM, provided the input signal level remains below −5 dBm. If the β-modulation index of FM is kept below 0.5, it can be handled as an AM signal, where all the information is kept within the BW. In FM the data BW is much higher than that of an audio. Therefore, usually 6 MHz BW must be allocated and the SO must have this amount of tracking range. Also, the video requires a linear phase, that is satisfied by the SO.

F. SO and CPSO are Used in Direct Sequence Spread Spectrum

When the SO is used for FM conversion, the output of the SO is applied to shift register for shifting the data. The output of the shift register contains all the necessary information concerning the video signal. This signal is applied to a Double Balanced mixer to be multiplied with the FM video signal to generate a BPSK data. Besides its simplicity this technique avoids a separate clock.

G. SO is also an Optical Amplifier and Synchronizer.

Light wave applied to a SO or a CPSO can be converted to an electrical wave by using a photo-detector on the tank circuit of the SO or CPSO. After the necessary signal processing the electrical waveform is converted back to optical signal by the use of another photo diode.

H. Product of Noise Rejection and Data BW is Maximized

Unlike classical networks where the product of data bandwidth or tracking range is kept constant, in a SO or CPSO, this product is maximized. This implies that both the noise rejection and the data BW are maximized. For example, increasing the regeneration gain, improves both the noise rejection and the data BW.

I. Acquisition Time of a SO is Fast

The acquisition time of a SO is a function of the data BW or tracking range and not of the instantaneous noise rejection BW. The SO can acquire within few cycles.

J. CPSO Provides Zero Phase Error and Increases the Data BW

The SO has 180° linear phase shift between the input frequency and the output, within the tracking range. The CPSO provides zero phase error between input and output, while extending also the data BW or tracking range.

The CPSO is generated by a SO and two external loops, where the input phase and output phase are compared on a φ-detector and the error is applied to the input of the oscillator. The CPSO works always at its resonant frequency.

3. Summary of Functions

The SO and the CPSO are universal networks that can perform the following functions:

synchronize, track, filter sample, modulate, divide with integer and rational integer numbers, in a single process. It is also an ideal AM to FM converter and provides excellent direct sequence, spread spectrum communications, without any frequency limitations. The SO is also a wideband, high "Q" communications network, with two independent filters. It is also an ideal PLL. It is also an ideal A/D and D/A converter. CPSO is also a zero phase filter and amplifier.

4. Energy and the SO

Unlike classical networks, the functional properties of a SO are determined by energy levels. There are two energy levels in a SO, the energy associated with the input signal and the internal energy associated with the regeneration gain. In order to provide high efficiency in the operation the input signal must arrive to the input of the oscillator transistor with minimum amount of losses. A tank circuit with low Q, for example presents less resistance to the input signal. If the main concern is the data bandwidth, a low tank circuit "Q" is advisable, while for high noise rejection a high regeneration gain and high "Q" are advisable.

If one parameter is changed at a time, high regeneration gain and high "Q" provide high noise rejection, wide data bandwidth and fast acquisition. High regeneration gain can be achieved by using bipolar transistors with high β's(>150).

When one transistor SO is used, where transistor $T_1$ is replaced with a resistor, to provide the second positive feedback, the emitter resistor must be bi-passed with a capacitor to reduce the resistance for the input signal. The main positive feedback in the SO is achieved through the capacitor $C_1$, in FIG. 14.

For proper use of the SO, the input signal must not exceed −5 dBm, so that the regeneration process of the oscillator is not affected. For AM modulation the input signal level is increased by several dBm. It must be kept in mind the SO is an ideal FM signal processing network, where the efficiency remains optimum.

In the 20's, the regenerative receivers were used in AM reception with high success, but the invention of the heterodyne and superheterodyne receivers, by Armstrong, the regenerative receiver was abandoned, due to its non-uniform reception throughout the band, because of varying "Q". A commentator on Regenerative Receivers, then, said that the regenerative receiver is so sensitive, there was no need for an antenna, even within the building. Another drawback of the regenerative receiver was the lack of sufficient regeneration gain in vacuum tubes. Regeneration was boosted by the input energy level.

5. The Synchronization Process

SO synchronization occurs in a different way than those of classical networks. For example, in a Phase-Lock Loop (PLL), the input signal is compared in phase to the output waveform and the error voltage, after integration, is applied to the VCO, to correct for the frequency. It is an indirect process, the continuity between the input signal and the oscillator waveform is lost. There is also only one filter in a PLL, that takes care of both the noise rejection and data bandwidth. Improving the noise rejection deteriorates the data bandwidth and vice versa.

The SO synchronization process is direct. The input signal applied to SO becomes part of the regeneration process.

Figure 12A:
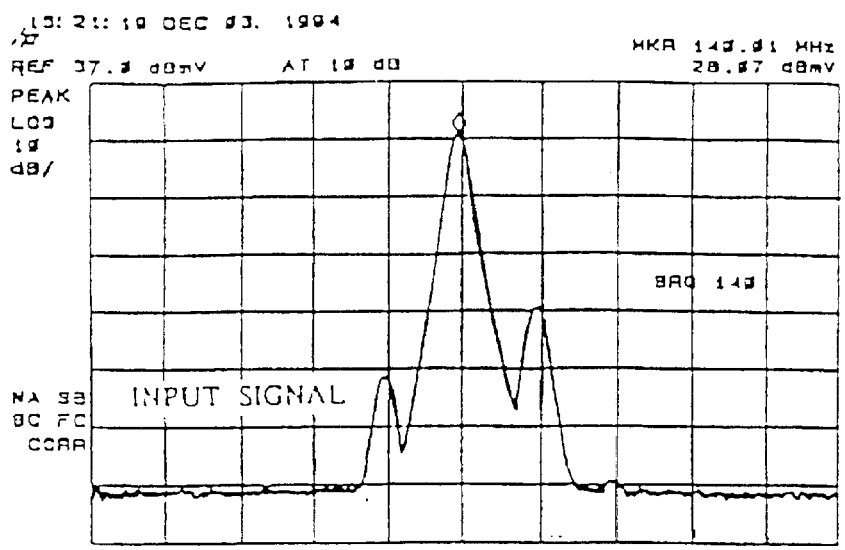
FIG. 12 is a schematic drawing illustrating an example of a synchronising process described in Annex A.
Figure 12B:
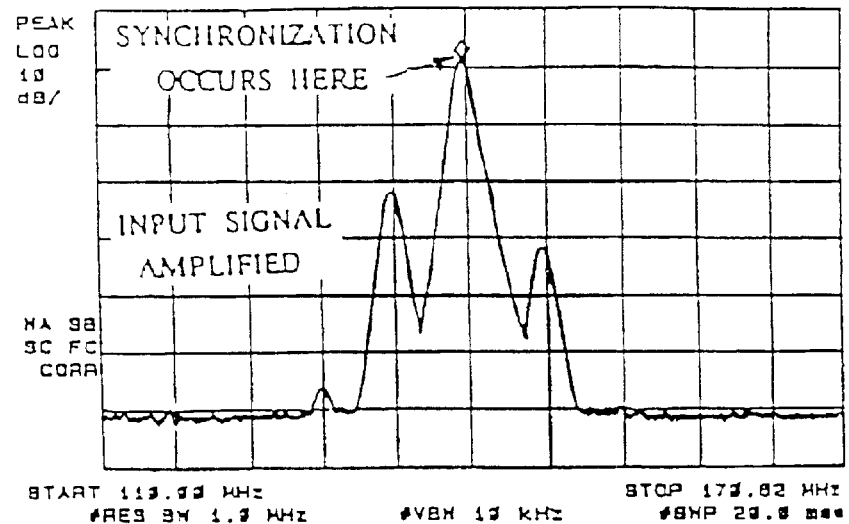

When regeneration amplifies the input signal and it reaches the amplitude of oscillations, it replaces the original amplitude of oscillations amplified by as much as 80 dB and improved S/N by as much as 70 dB. FIG. 12 shows part of the regeneration process. FIG. 12a shows the input signal and the harmonic climbing towards the peak of the oscillator spectrum, while FIG. 12b shows the amplified input signal and the two harmonics approaching the peak. When the input signal reaches the peak it replaces the original oscillations. Therefore, the synchronization process is direct and the synchronized signal or output signal is the same as the input signal. There can be no error in frequency.

Figure 14:
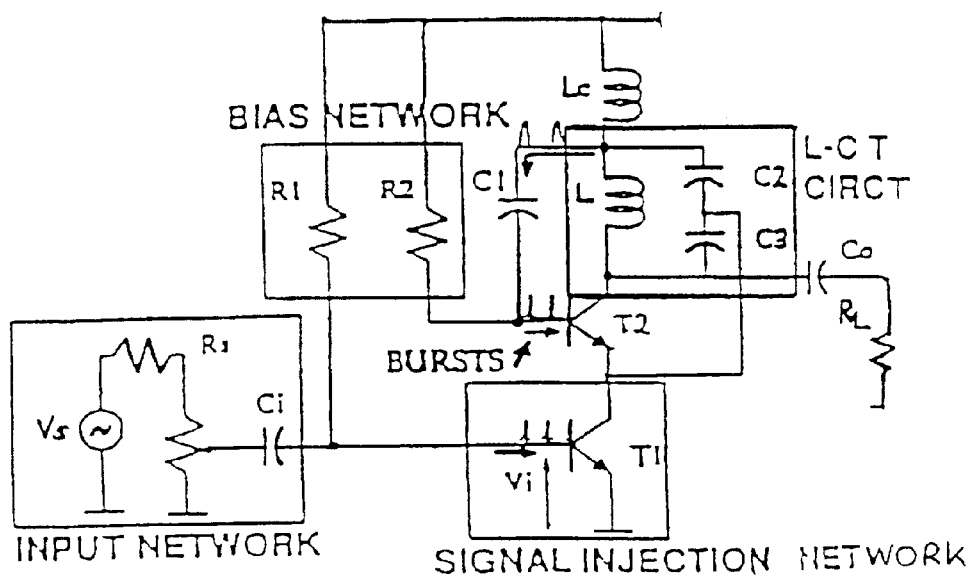
FIG. 14 is a schematic circuit diagram for an example SO described in Annex A.

The input signal, for the circuit of FIG. 14, should not exceed −5 dBm, so that it does not disturb the original oscillations, until it replaces it.

The process of synchronizations, tracking, filtering, modulation, sampling, amplification and division depend on regeneration gain and the amount of input signal energy. This is true also for the CPSO.

Figure 13:
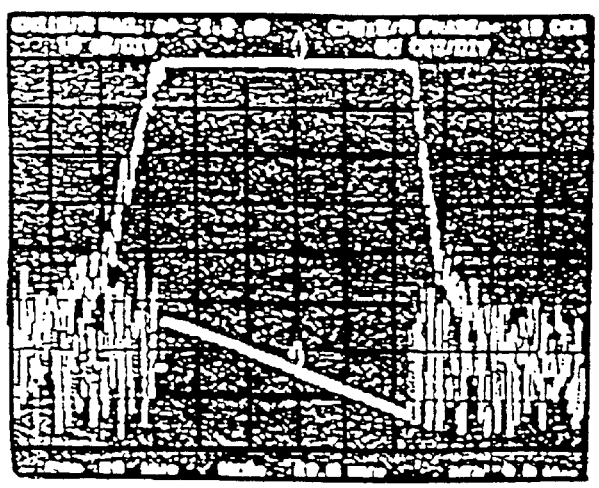
FIG. 13 is a graph illustrating example Gain-Phase curves described in Annex A.

Constant output of the SO, for every input signal level, does not imply saturation. Saturation in classical networks is replaced by self-regulation. The phase error between input and output of the SO is always 180° for the SO and zero degrees for the CPSO. FIG. 13 shows the gain-frequency and the phase-frequency characteristics of the SO.

3. Proof #1
Why Flat Data BW

Figure 15:
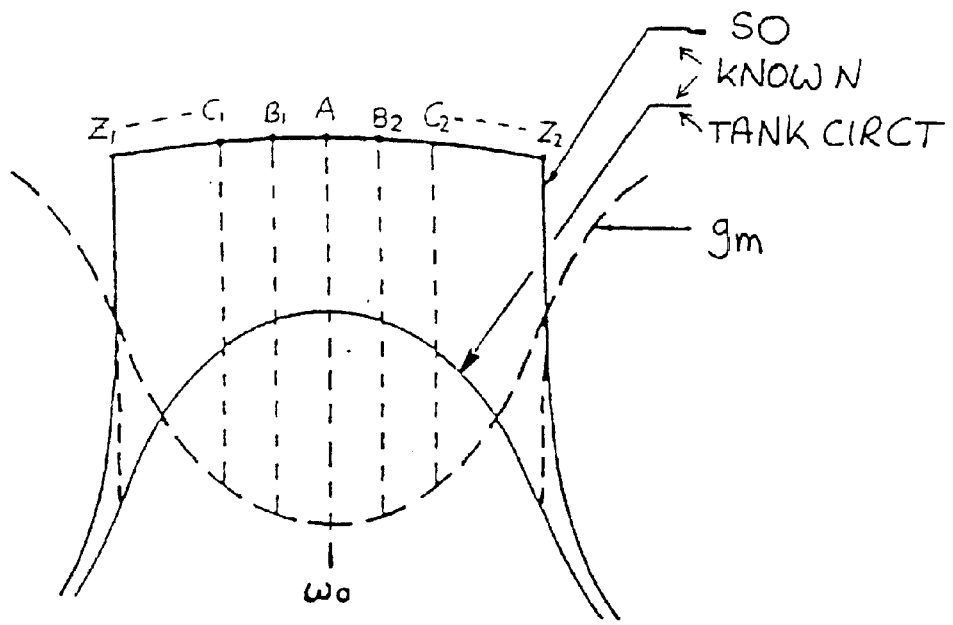
FIG. 15 illustrates examples of Data BW, Tank Circuit "Q", and Regeneration Gain Curves described in Annex A.

FIGS. 13 and 15 show the synchronization curves of the SO. The data bandwidth or tracking range is flat and wide with abrupt transition corners. According to classical network theorems, such a transfer function can not be realized nor its linear phase function, shown in FIG. 13.

Figure 16:
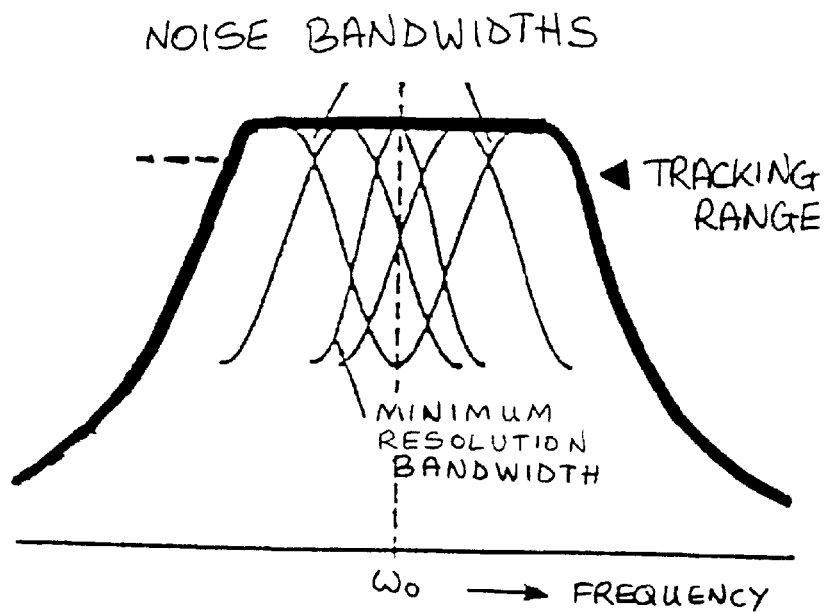
FIG. 16 illustrates examples of two filters of an SO described in Annex A.

The SO data bandwidth or tracking range is formed by the summation of all high "Q" noise rejection filters, as shown in FIG. 16. The only way the flat and wide data bandwidth or tracking range can be realized is for the regeneration gain curve to be inversely proportional to the "Q" curve, the product of which gives the flat and wide data bandwidth transfer function. When regeneration gain goes up, the amplitude of oscillation goes down to provide self-regulation. The collapse of the data BW transfer function occurs when the regeneration gain and the input signal energy cannot compensate for the tank circuit losses. Therefore, $$g_m \times "Q" = CONSTANT$$

The "Q" is related directly to amplitude of oscillations. Self-regulation process exists in all biological and natural phenomenon. We don't see 20 feet tall people nor the fish population in a pond increases without bound. Self-regulation is essential.

Self-regulation will be analyzed also under proof #3.

4. Proof #2
The Three Filters of SO

The two of the three filters of a SO are shown in FIG. 16. The third filter is associated with the class "C" operation of SO and is a sampling filter, in this case a low-pass filter. The instantaneous or noise rejection high "Q" filter is due to the LC tank circuit. The summation of all instantaneous filters generate the data bandwidth (or tracking range), both of which are necessary for the unique and powerful operation of the SO. The third filter also enhances the noise rejection, but not absolutely necessary. Note, in FIG. 16 the instantaneous filters are widening, as the frequency moves away from the center frequency. In CPSO all instantaneous filters have the same "Q", because the CPSO operates always at its resonant mode. Because of this property, the CPSO has zero phase error and wider data BW, for the same input level to the SO. The sudden collapse of the tracking range denotes that the input signal energy and the internal regeneration gain are not sufficient to overcome the tank circuit losses.

5. Proof #3
Self-Regulation

The self-regulation properties of SO is a universal process that is observed in nature, and in biological existence. We don't see trees reaching the skies, nor the fish population in a pond grows indefinitely. Also, Einstein's energy equation $E/m=c^2$, is self-regulated by the square of the velocity of light.

Figure 18:
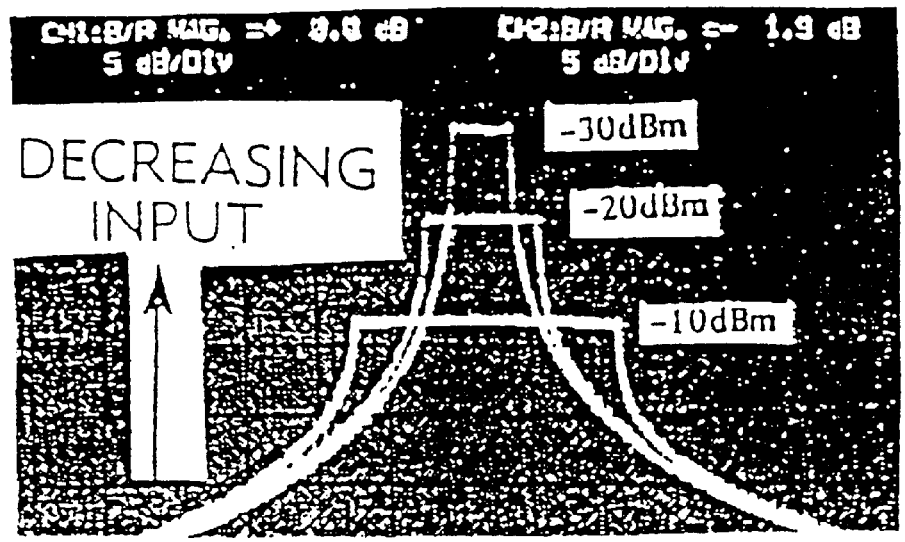
FIG. 18 illustrates examples of SO gain on three input levels described in Annex A.

In an oscillator, continuous positive feedback should lead to self-destruction. But, this does not happen, because of self-regulation. Within the boundaries of the tracking range (or data BW), no saturation occurs in SOs or CPSOs. Saturation in classical networks is replaced by self-regulation. The product of Amplitude of Oscillation X Regeneration Gain remains constant. Another self-regulation occurs in the product of input signal level X Regeneration Gain, remains also constant, as shown in FIG. 18.

6. Proof #4
High Noise Rejection

High noise rejection is performed by two filters, the high "Q" tank circuit filter, and the sampling filters. The data BW (or tracking range) is formed by the summation of all instantaneous filters. The SO or CPSO operates similar to a spectrum analyzer, where the noise rejection filter of the SO corresponds to the resolution BW of the analyzer. The sampling filter performs also good noise rejection. In sampling, the periodic signals add directly, while the noise adds rms-wise and S/N improvement is given by:

$$S/N = 10 \log N$$

where N is the number of samples. By sampling 1000 times the S/N can be improved by 30 dB.

Figures 17A, 17B:
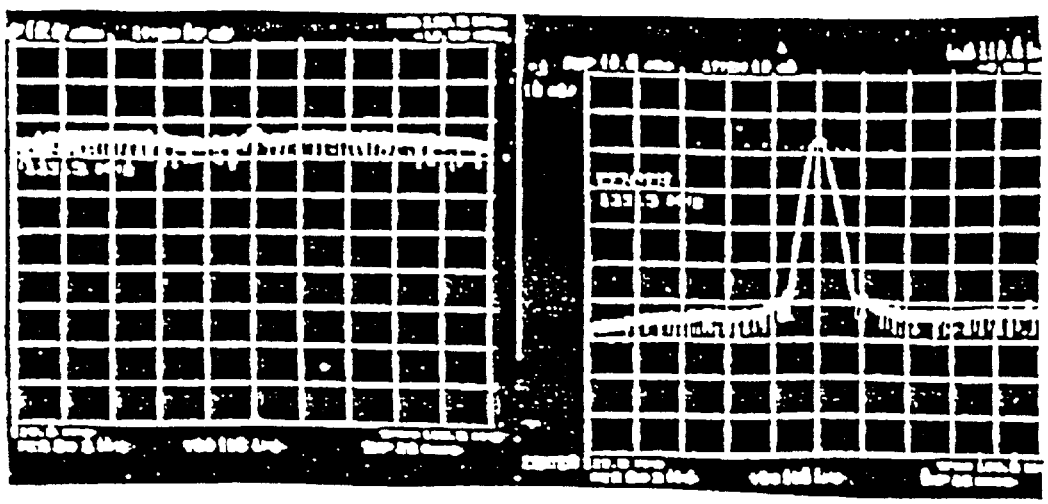
FIG. 17 illustrates an example of SO Noise Rejection described in Annex A.

FIG. 17a shows a display of a noisy signal, which is applied directly to the spectrum analyzer, while FIG. 17b shows the same signal applied to the spectrum analyzer through the SO. The S/N improvement is over 40 dB. The resolution BW of the spectrum analyzer is set to 3 MHz, so that its effect on noise rejection is minimal. The S/N improvement can be approximated by:

$$S/N = 40 \ dB = 10 \log(3 \ MHz/SO \ Noise \ BW)$$

For 40 dB improvement in S/N, the noise rejection BW is given as 300 Hz, while the SO is enjoying 1 MHz data BW or tracking range.

The effective "Q" of the SO is determined using expression $$Q = \bar{\omega}_o / 3 \ dB \ BW$$

where $\bar{\omega}_o$ is the center frequency.

For 140 MHz carrier the effective 'Q' is $2.9 \times 10^5$. This is a moderate 'Q', for SO.

7. Proof 5
Input Signal Sensitivity and Regeneration Gain

All functional properties of SO depend on the regeneration gain and the input signal sensitivity. Higher regeneration gain implies better noise rejection, wider data BW (or tracking range) and faster acquisition time. This is why the SO and the CPSO belong to a new class of networks, called Energy Functions. High regeneration gain can be achieved by using high β-transistors(>120) and more than one positive feedback, as in FIG. 14. High regeneration gain implies also high input signal sensitivity. The input signal sensitivity is given by $$S=KE^{-2/3}$$

where K is a constant and E is the input energy or input signal level. Expression implies that the signal sensitivity tends to infinity as the input energy goes to zero. For the circuit in FIG. 14, the input signal sensitivity is −100 dBm and input signal-to-noise ratio sensitivity is −40 dB. These numbers for a PLL are −25 dBm and +3 dB, respectively. The input signal and input S/N sensitivities are directly proportional to the regeneration gain. FIG. 18 shows a SO with three input signal levels, 0 dBm, −10 dBm and −20 dBm. The regeneration gain, on the other hand is inversely proportional to the input signal level.

S/N improvement as high as 70 dB and regeneration gain as high as 80 dB were observed. Very good tests on 3000 students, revealed that the ones who scored high are those who used the least amount of energy in their brains.

8. Proof 6

Sampling Process

Figure 19:
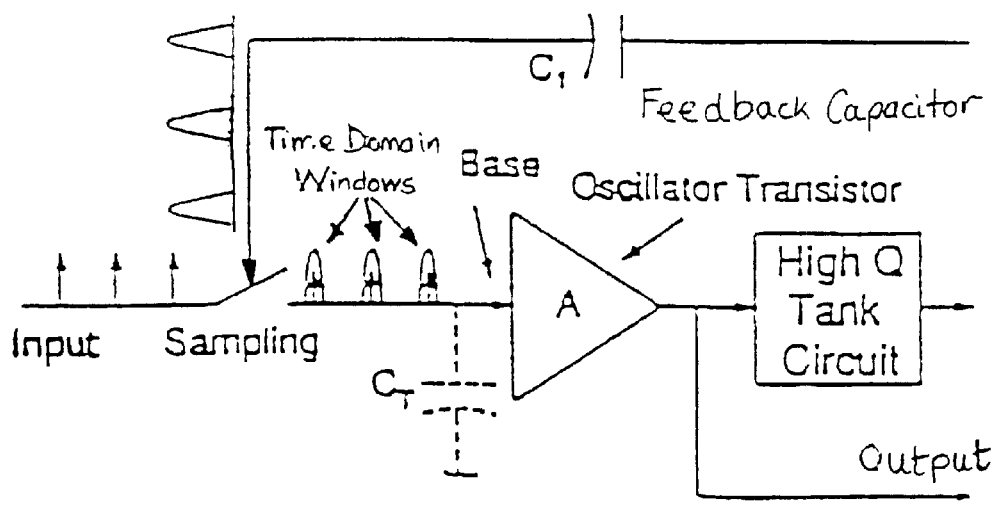
FIG. 19 illustrates an example of a sampling process in an SO described in Annex A.

Sampling is due to class "C" operation of the LC oscillators. FIG. 14 and FIG. 19 show the sampling waveforms which occur in bursts, on the positive feedback path of the oscillator. The input signal, a pulse in this case, enters the bursts or time windows and together they enter the oscillator. The width of the window determines the maximum tracking range, in frequency domain.

Sampling is an ideal correlation process and provides ideal filtering (low-pass in this case), one of the three internal filters of SO or CPSO. FIG. 16 shows only the two filters. The SO has no frequency limitation, nor noise rejection limitation or tracking range limitations. Likewise sampling with SO has no frequency limitations. SO can sample at GHz frequencies. Frequency of operation of SO and CPSO depend on the frequency limitations imposed by individual components.

12. SO and CPSO Performances (A Design)

Figure 20:
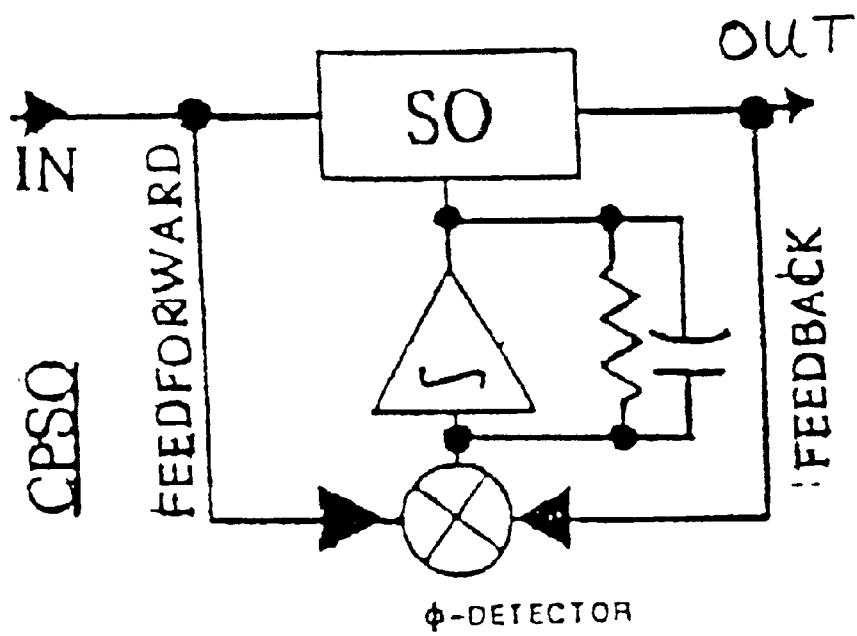
FIG. 20 is a schematic block diagram of an example CPSO described in Annex A.
Figure 21:
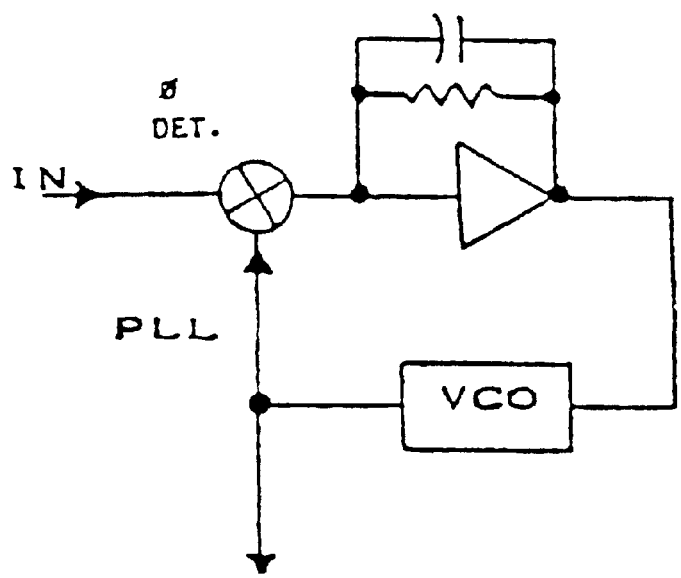
FIG. 21 is a schematic block diagram of an example PLL described in Annex A.

FIG. 20 shows the block diagram of a CPSO. The input and output frequencies are applied to a phase detector, the phase error of which is applied through an integrator to the SO. FIG. 21 shows the block diagram of a PLL, for comparison. The PLL has one feedback loop, while the CPSO has one feedback and one forward loop. In the CPSO the synchronization or input signal is applied directly to the SO, where frequency synchronization occurs instantaneously, while phase error is corrected after crossing the phase detector, and the integrating amplifier. The CPSO retains all the features of a SO, while providing also zero phase error and wider tracking range for the same input to a SO. By providing coherency the noise rejection and the input signal sensitivity remains optimum throughout the tracking range.

Figure 22:
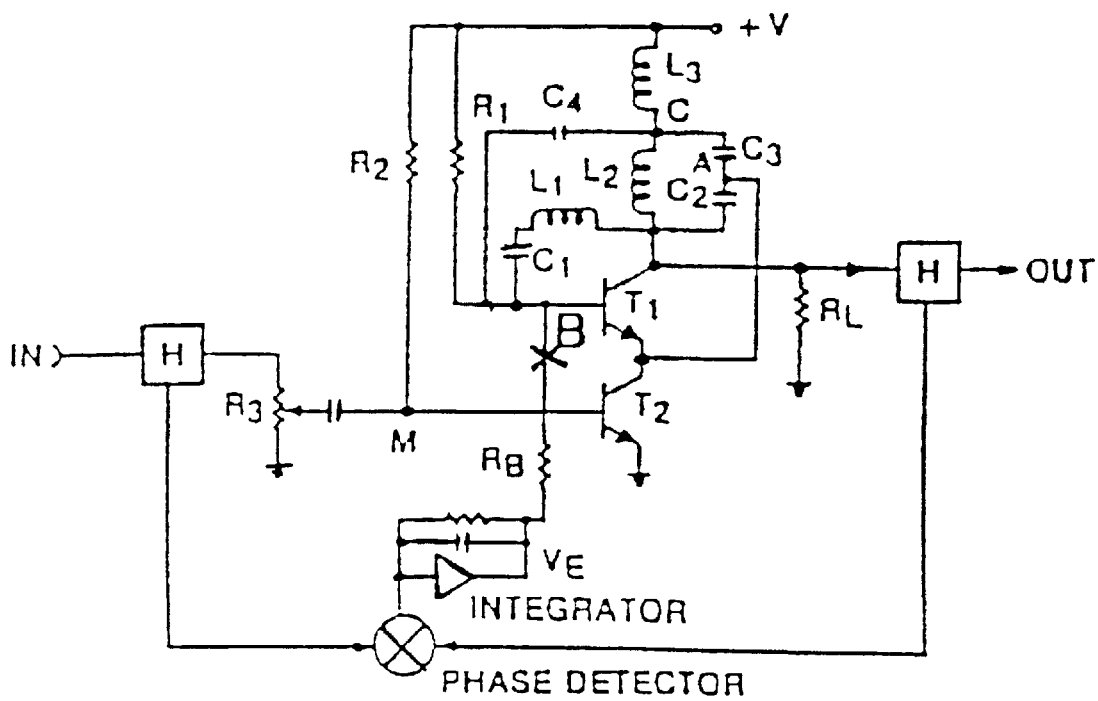
FIG. 22 is a schematic circuit diagram of an example CPSO described in Annex A.

FIG. 16 shows the two internal filters of a SO. Note that the "Q" becomes wider as the input frequency moves away from the center or resonant frequency. On the other hand the "Q" in a CPSO remains always at its optimum level throughout the tracking range. That is the "Q" remains at its resonant frequency level throughout the tracking. A circuit diagram of a CPSO is shown in FIG. 22.

Figure 25:
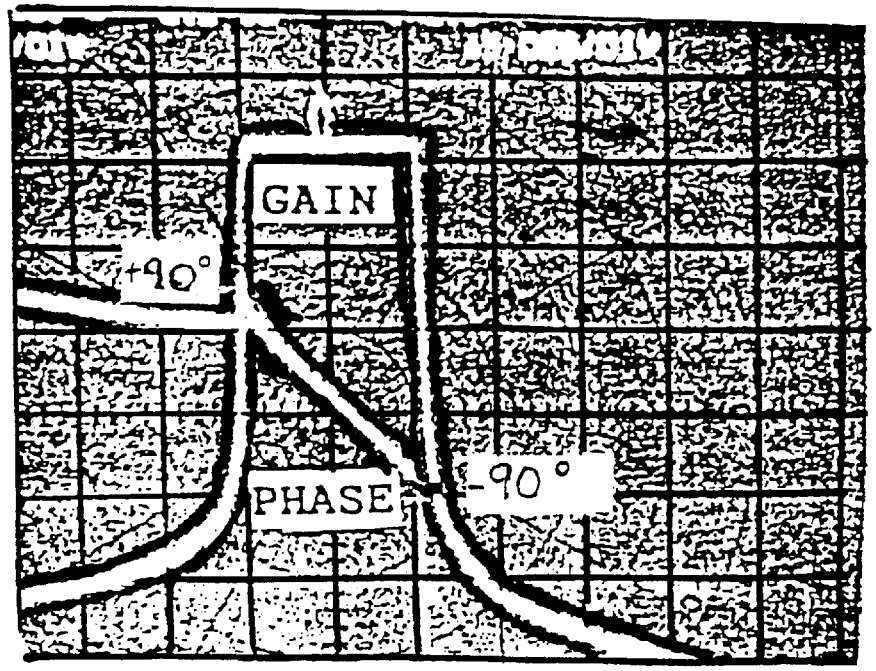
FIG. 25 illustrates example Gain-Phase synchronisation curves of an SO described in Annex A.

Gain-phase curves of a CPSO are shown in FIG. 25.

The Synchronous Oscillator an Approach to Biological Energy Efficiency

Operation of a Synchronous Oscillator

Figure 24:
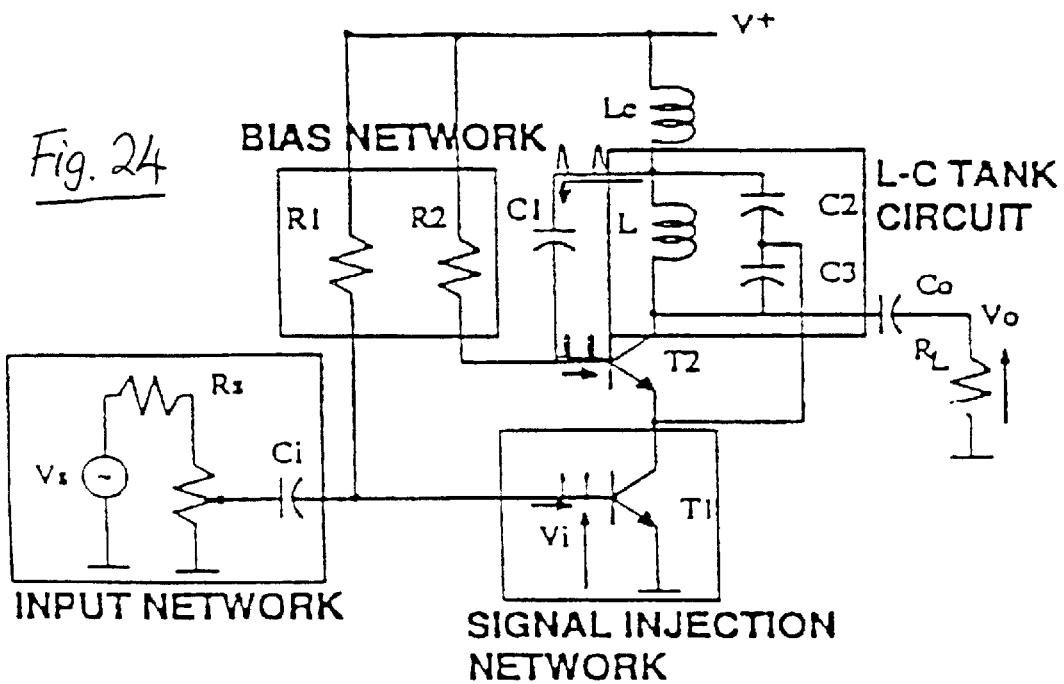
FIG. 24 is a schematic circuit diagram of an example SO described in Annex A.

FIG. 24 shows a Synchronous Oscillator circuit diagram. L,$C_2$+$C_3$ provide the tank circuit, $T_1$, $T_2$ are the high gain transistors, $C_1$ is the positive feedback capacitor, $L_C$ is the choke coil to provide buffer for the power supply and also forces the positive feedback to the base of the $T_2$ transistor. Transistor $T_1$ accepts the input and injects it to transistor $T_2$. This stage provides buffer for the oscillator transistor to the outside world. It provides also gain for the input signal. Resistors $R_1$ and $R_2$ are biasing resistors for the transistors, where most of the power dissipation occurs. Positive feedback through $C_1$ to the base of $T_2$ occurs in bursts, due to class "C" operation of the oscillator transistor $T_2$.

Gain-Phase synchronization curve of SO are shown in FIG. 25. The gain curve is flat and wide and the phase 180° and linear.

The SO has three internal filters:

a. High "Q" noise rejection filter or the instantaneous filter, which is called also the tuning filter. The summation of all instantaneous filters form the tracking range (or data filter).

b. The data filter or tracking range. This filter operates, for all practical purposes, independent of the instantaneous filter. This filter may track 5 MHz or higher data, while the instantaneous filter BW can be as low as few hundred Hz. The two filters provide the only available technique to have high noise rejection while tracking wideband data.

c. The third filter is the sampling filter, due to class "C" operation of SO. This provides additional noise rejection, but not essential for the operation of SO.

Another unique and powerful functional property of the SO is its high regeneration gain and high input signal sensitivity of the SO which are inversely proportional to the input signal level. This implies that the SO can detect the lowest possible input signal (−100 dBm) and the lowest possible input signal-to-noise ratio (−40 dB), independent of its tracking range or data BW.

Still, another powerful property of the SO is the presence of Self-Regulation in all its functional performances. They are:

INPUT SIGNAL LEVEL X REGENERATION GAIN

REGENERATION GAIN X AMPLITUDE OF OSC.

INPUT SIGNAL SENSITIVITY X INPUT SIGNAL

Their product is always constant.

With the above introduction we will discuss the functional performances of SO.

Operation of SO

The following are the requirements for the operation of SO:

The input signal level to circuit, in FIG. 24 should not exceed −2 dBm. Higher input signal level may disturb the oscillations.

The regeneration gain must be high enough not to be disturbed by the input signal level.

When the input signal, enters the bursts of the positive feedback, as shown in FIG. 24, together they become part of the regeneration process, if the two properties above are observed.

The input signal, that becomes part of the regeneration process, is amplified. When it reaches the peak of the regeneration process, it replaces the original oscillations.

The two signals are out of phase by 180°, at the input of SO, before they become part of the regeneration process. When the input signal becomes part of the regeneration process, its phase changes by 180° to comply with the phase of oscillations. In order for the regeneration process to amplify the input signal, they must have the same phase.

Operation of FIG. 24 suggests that they are ±90° apart before the input signal becomes part of the regeneration process. This is the only way two signals ±90° apart can coexist.

Figure 26:
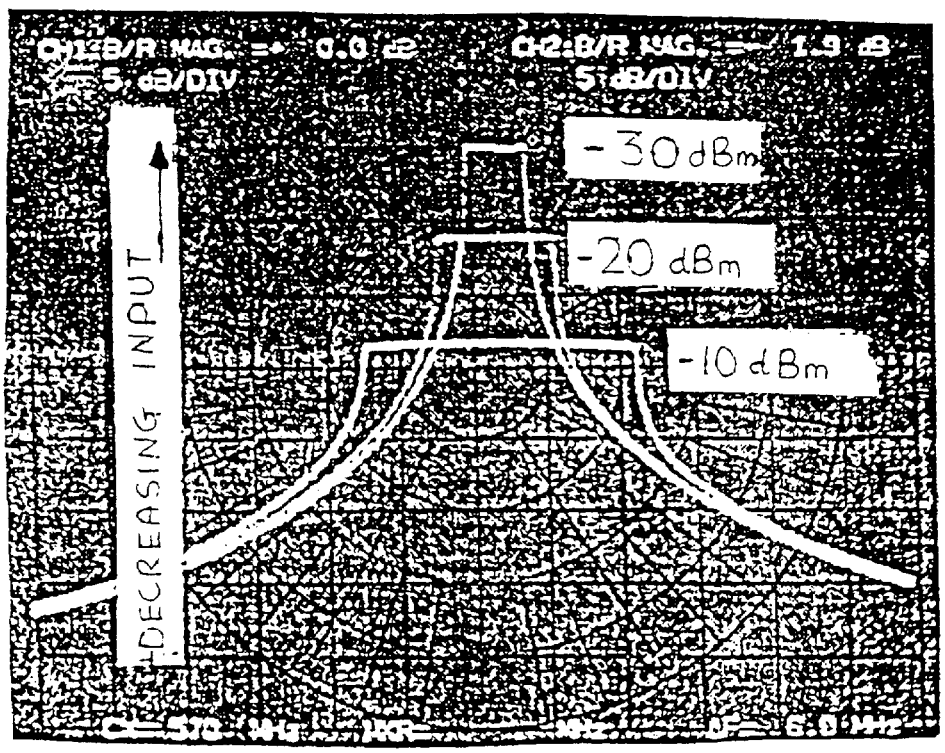
FIG. 26 illustrates an example of Gain being inversely proportional to Input Signal, described in Annex A.
Figure 27:
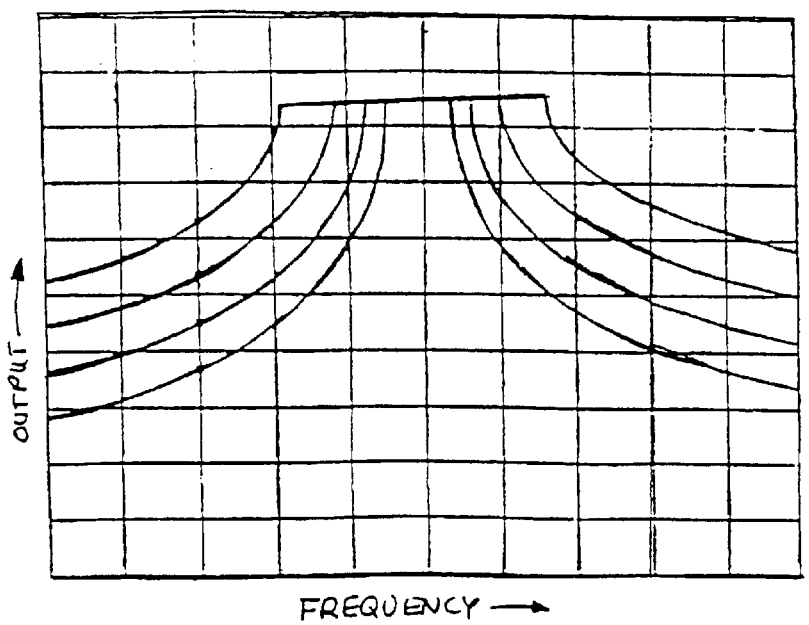
FIG. 27 illustrates example amplitude of oscillations of an SO described in Annex A.

In FIG. 26, the lowest input signal (−30 dBm) has the highest gain. Increasing the input signal level, more resistance is rendered to the positive feedback due to ±90° phase difference. This reduces the positive feedback to SO and the regeneration gain decreases. This is the proper explanation for the behaviour of SO in FIG. 25. The regeneration gain for the input signal is provided by the internal regeneration process and not by the input signal. The energy level of the input signal determines only the tracking range. This can be depicted by the constant amplitude of the tracking curve. Although gain changes to compensate for the losses of the tank circuit, when input frequency shifts to the right or left, the amplitude of oscillations remains always constant, as observed in FIG. 27.

The energy for all the functions performed by SO are provided by the internal regeneration process not by the input signal. Input signal determines the tracking range or data BW. Likewise, when input signal level is reduced, by some reason, the tracking range increases due to self-regulation. As long as there is no change in the amplitude of oscillations there is no energy used. The product of regeneration gain and input signal level is kept constant. There is also an internal energy exchange between the tracking range and the regeneration gain, another Self-Regulation process. No external energy is needed, as can be seen in FIG. 26.

The input energy applied to SO can be as low as −100 dBm, compared to the internal energy of +10 dBm, a difference in the order of +110 dB. Yet the input signal takes over the regeneration process, an approach to perpetual motion action.

Negative Impedance Conversion
(Positive Feedback is Accompanied by Second Feedback)
A Synopsis The feedback between collector and emitter is considered a negative feedback, in non regenerative circuits. Here, it presents a powerful feedback that generates a Negative Impedance Conversion (NIC), between the collector and the base, in FIG. 28.

It pumps energy into the circuit that multiplies the oscillating frequency by four. Moreover, it provides a wider tracking range or data bandwidth, higher noise rejection. It improves also the frequency stability and the jitter. This performance implies that the regeneration gain is further enhanced in the circuit. This feedback technique is used in carrier recovery techniques of QPSK modems, where the 140 MHz IF frequency is automatically converted to 560 MHz.

Figure 29:
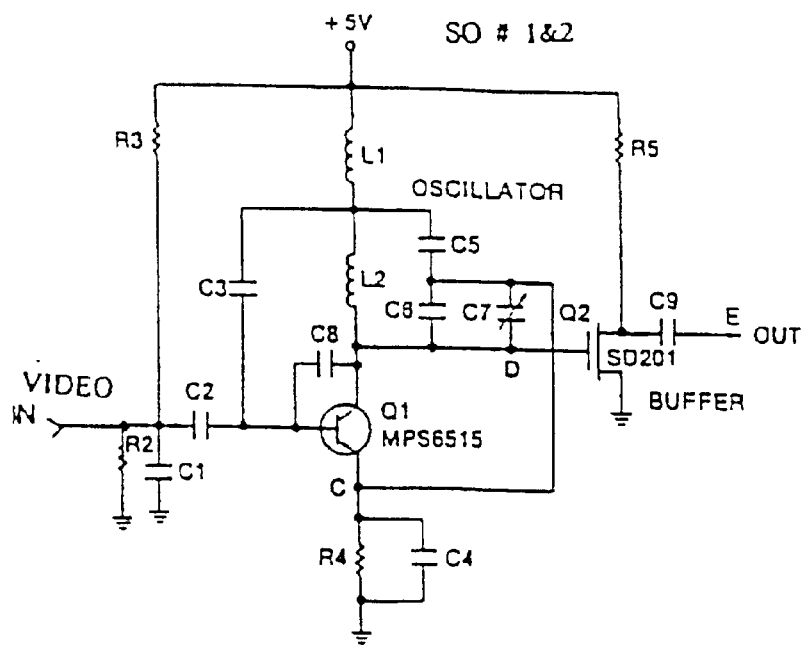
FIG. 29 illustrates an example of a one-transistor NIC described in Annex A.

In one transistor SO, a single capacitor feedback, with 150 pF capacitor provides three times multiplications of frequency. For example, a 48 MHz SO frequency is automatically converted to 140 MHz IF frequency. Such a circuit is shown in FIG. 29. In the two transistors SO the values of LC components are very high, such as few mH for the coil and several hundred pico farads for the capacitor.

This network, with negative impedance conversion, can be used in transmission lines, to increase their functional properties, in frequency, tracking range, noise rejection and provide also better frequency stability and lower phase jitter. Also, along the same lines, they can be used in microelectronic integrated circuit manufacturing, where by pumping energy, into the network, can increase their frequency and improves their functional properties. Transistors, with poor frequency responses, such as not exceeding 100 MHz, were used to operate at much higher frequencies, by promoting the third and forth harmonics, where wider tracking ranges, higher noise rejection, improved frequency stability and lower jitter were observed. These improvements are only possible, because the second feedback pumps energy into the system. Poor quality PC boards and poor quality transistors can be enhanced by NIC to provide high quality functions that could not be possible otherwise. Also, poor quality transmission lines can be enhanced to provide high quality performances.

The SO and the NIC

The SO is an energy efficient network, that approaches the biological efficiency. It has unique and powerful functional properties that no classical network, in any form and complexity, can provide.

Figure 28:
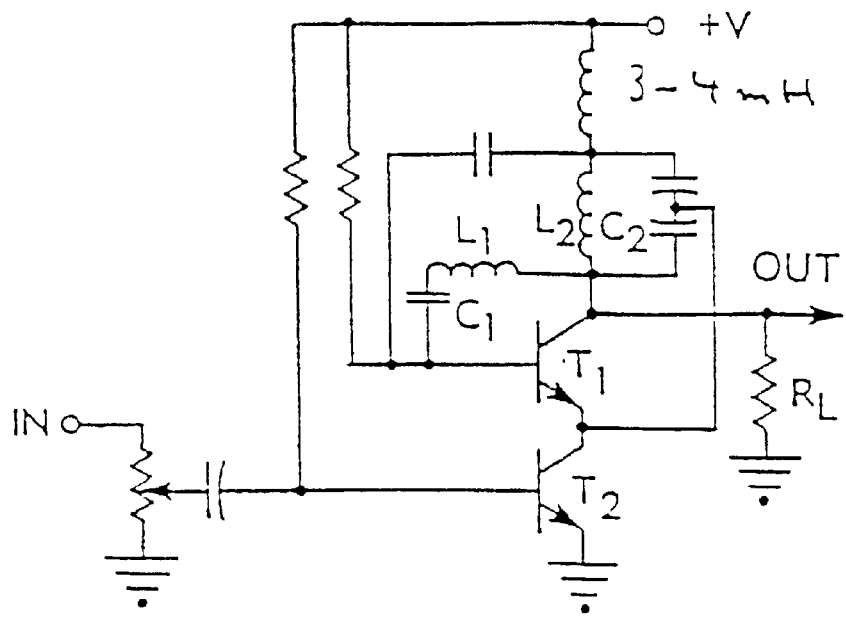
FIG. 28 illustrates an example SO with Negative Impedance Conversion described in Annex A.

The NIC/SO performs all the functions a SO can, with even further improvement in functional performances and operate also at higher frequencies. The SO/NIC pumps energy into the SO, that enhance the harmonics. Two SO/NIC circuits are shown in FIGS. 28 and 29. FIG. 28 enhances the fourth harmonics, while FIG. 29 enhances the third harmonics. This enhancement, due to energy supply into the system, relies on the level of harmonics in the oscillator.

For our designs and claims we use the SO/NICs. This is true also for the CPSO/NICs. The author has used, the two transistors SOs, providing multiply by four SO/NICs for QPSK carrier recovery networks and replaced PLLs at various frequencies, without any limitations in frequency, data BW or noise rejection. Also, the jitter and the frequency stability are improved by significant amount.

Figure 30:
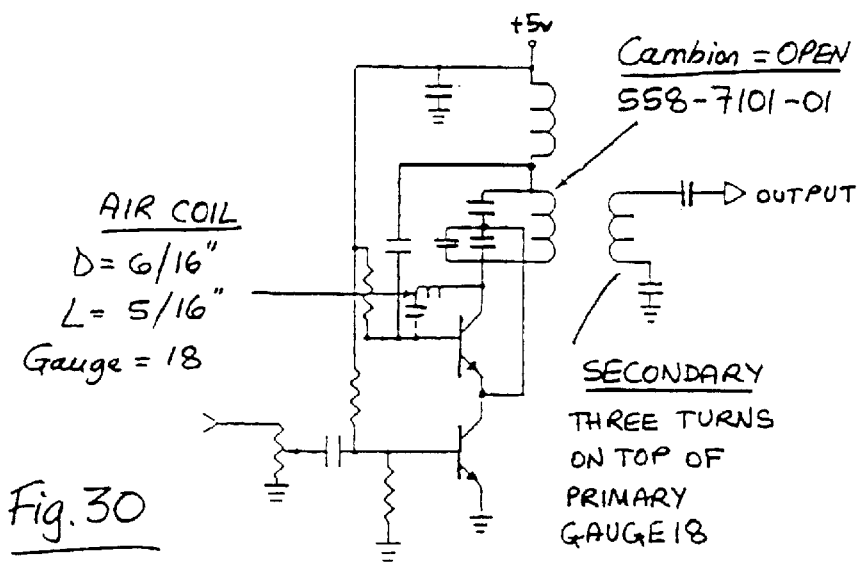
FIG. 30 illustrates an example SO with NIC used for a Carrier Recovery Network described in Annex A.

The SO/NIC circuit shown in FIG. 30, designed for 140 IF, with NIC it is used at 560 MHz, for burst mode QPSK, 120 Mbit modems. The BER curves for this circuit are shown in FIG. 31.

Figure 31:
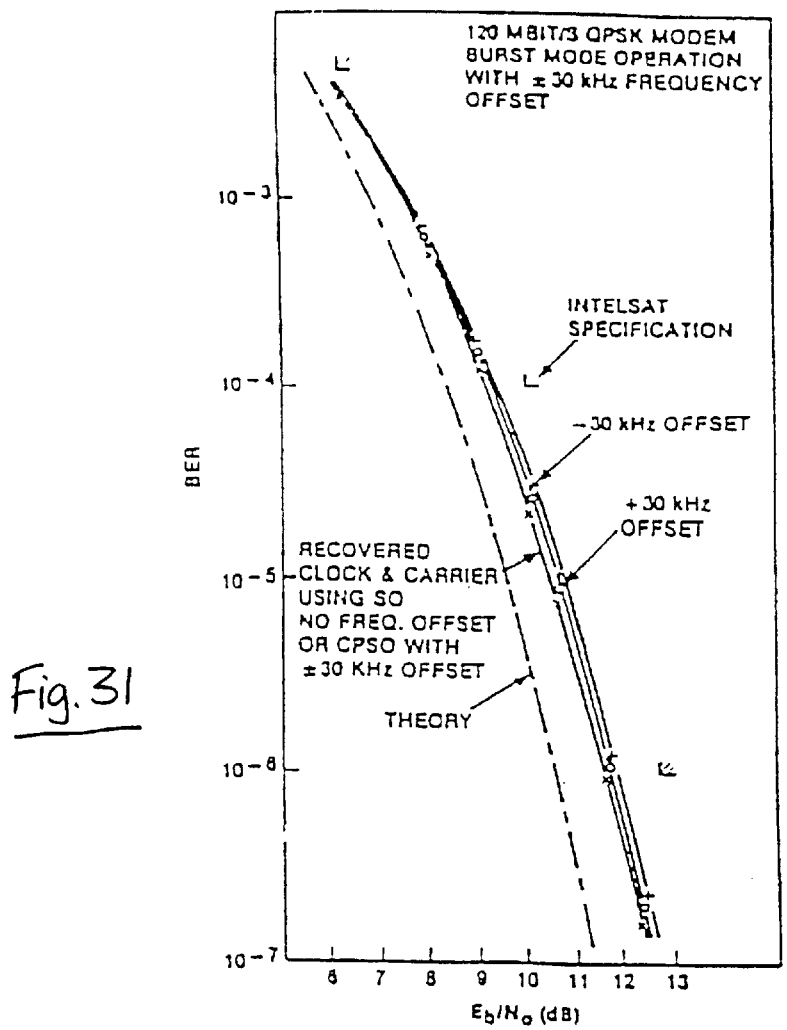
FIG. 31 illustrates example BER curves for a 120 Mbit Modem described in Annex A.

FIG. 31 shows the operation of a 120 Mbit burst mode modem. Its performance is similar to the back to back operation. BER curves are almost on top of each other and they are close to the theoretical performance. No other circuit can perform so well, as experiments reveal.

SUMMARY OF PREFERRED FEATURES

Feature 1
SO as Zero Phase Band-Pass Filter

Figure 23:
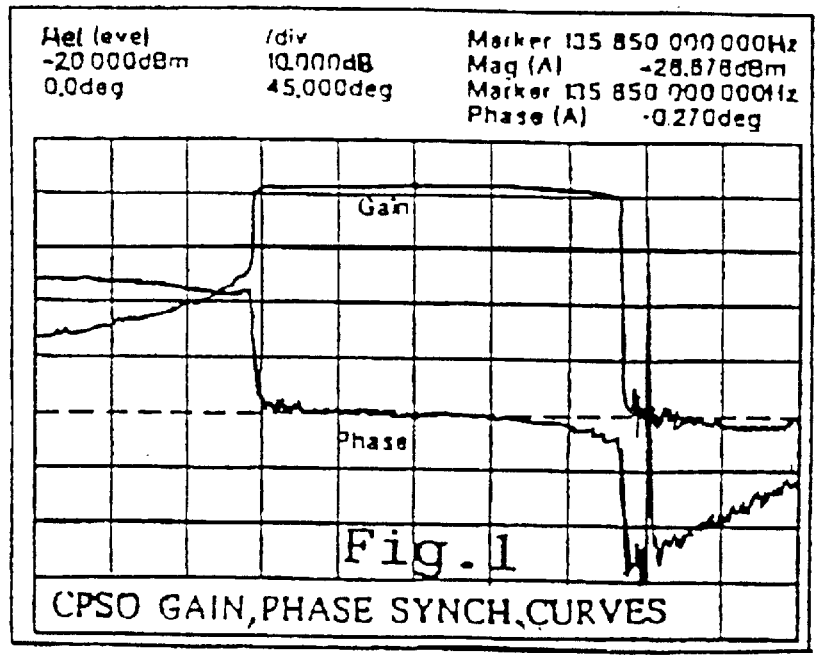
FIG. 23 illustrates example Gain-Phase curves of an SO described in Annex A.

Zero Phase is provided by the CPSO, shown in FIG. 22 and its phase in FIG. 23.

The SO has internally three independent filters, the high "Q", instantaneous filter, the tracking range (or data BW) and the sampling filter, due to class "C" operation of SO or CPSO. Although the first two filters are essential for the operation of SO or CPSO, the sampling filter is not. But, it enhances the overall noise rejection. The summation of all noise rejection or instantaneous filters generate the tracking range or data BW (see FIG. 16). The tracking range or data BW is directly proportional to the input signal level and inversely proportional to the amplitude of oscillations, because the input signal sees less resistance in its widening, due to lower amplitude of oscillations. All functional properties of SO are energy dependents.

The "Q" of the SO or CPSO is determined by using FIG. 16, which in turn provides the information for the instantaneous BW or noise BW. The SO can have 100 HZ noise BW or instantaneous BW, while enjoying up to 12 MHz tracking range or data BW. The SO or CPSO can provide also, 80 dB gain and up to 70 dB signal-to-noise ratio improvement, as a filter. Only the CPSO can provide zero phase error and the noise rejection and amplification associated with it. The CPSO circuit diagram and its phase are shown in FIGS. 22 and 23.

Feature 2

SO as a PLL

Figure 32A:
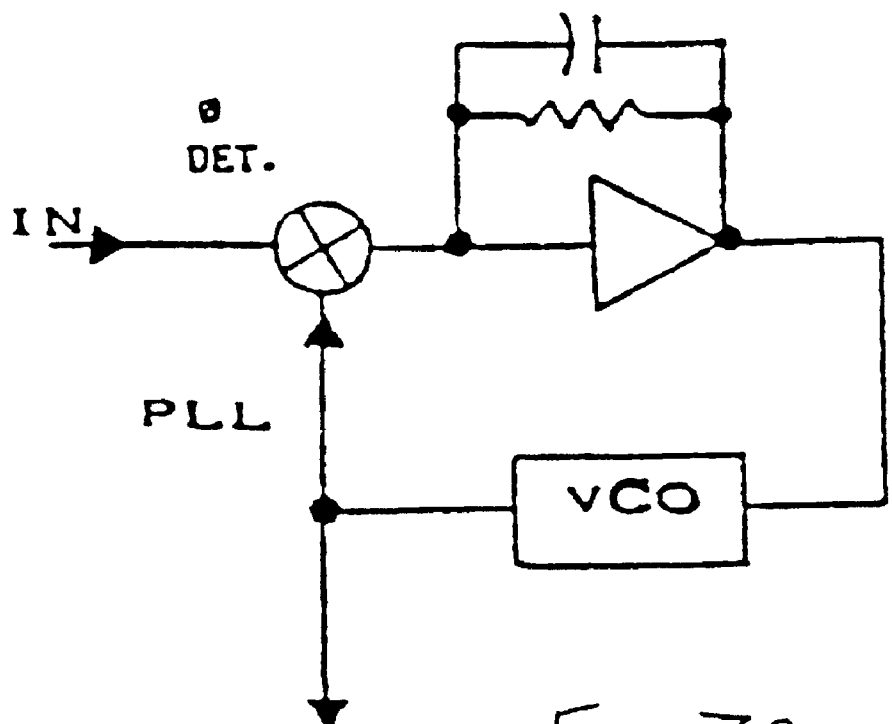
FIG. 32A is a schematic block diagram of a PLL described in Annex A.

The block diagram of a classical PLL is shown in FIG. 32A.

The popularity of PLL does nothing to reduce the basic shortcomings and limitations of a PLL.

It consists of a phase detector, an integrating amplifier and a voltage controlled oscillator (VCO). The Synchronization in a PLL is not direct. The input signal is first changed to phase information by the phase detector. Then crosses the integrating amplifier and finally is applied to VCO as an error voltage for synchronization. It produces error on its way to the VCO and VCO has its owns problems. The process is a slow one. Problems exist between noise rejection and data BW or tracking range, because design in classical networks is characterized by a performance trade off between high noise rejection and wide data BW or tracking range. Improving noise rejection, the data BW deteriorates and vice versa. These problems are due to the presence of only one filter within their structure in classical networks that provide only one choice. One is forced to perform compromises that do not work. The design with classical networks is limited.

Figure 32B:
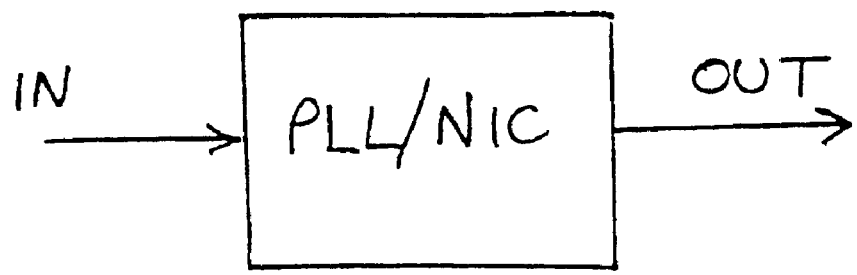
FIG. 32B is a schematic block diagram of an example SO/PLL described in Annex A.

The SO used for PLL is a simple SO circuit with a NIC, as shown in FIG. 32B. The SO or SO/NIC don't have any of the problems a PLL has. It has internally, at least two filters and the designer can choose both the noise rejection filter and the tracking range independently. The noise rejection filter can be 100 Hz wide, while the data BW or tracking range can be as high as 5 MHz or even higher. In SO no compromises are needed. The designer can choose noise rejection BW (instantaneous BW) independent of data BW and vice versa.

Moreover, the input signal sensitivity of a PLL is limited to −25 dBm and the signal-to-noise ratio sensitivity to +3 dB. In SO the same numbers are −100 dBm and −40 dB, respectively. A standard SO or SO/NIC, shown in Figures, can be used, as a PLL, with minor variations. The SO is a simple network and uses 3 mW.

Feature 3

Audio/Video/Digital Transmitter

Figure 33:
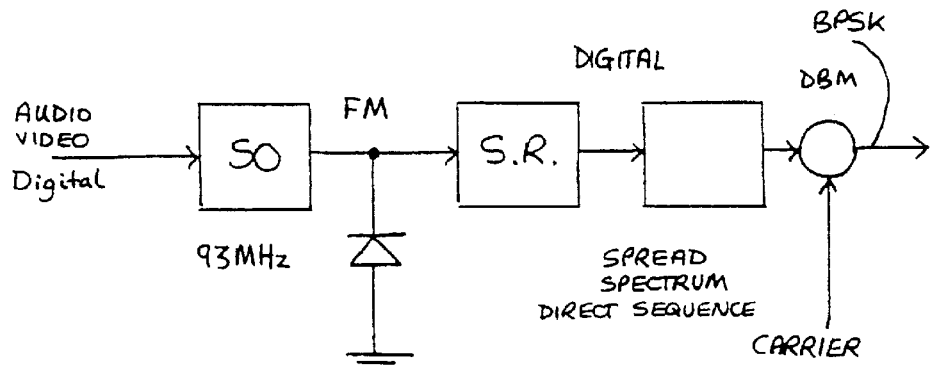
FIG. 33 illustrates an example BPSK transmitter described in Annex A.

FIG. 33 shows the block diagram of audio/video/digital transmitting network. The SO converts audio, video and digital inputs to FM. The audio, video and digital information at the output of the SO is stored in a shift register (set-reset type FF). The information in a FM is stored in the zero crossings. The information in the shift register is in PPM (Pulse Position Modulation) or time domain. Direct sequence spread spectrum is added to the existing system, by adding a Maximal Length shift register, or any type of length is cascaded, as shown in FIG. 33. As information in both registers are in time domain, no clock is needed. The PPM information is applied to a DBM (double balanced mixer) to generate a BPSK transmitting system.

Feature 4

BPSK Receiver

Figure 34:
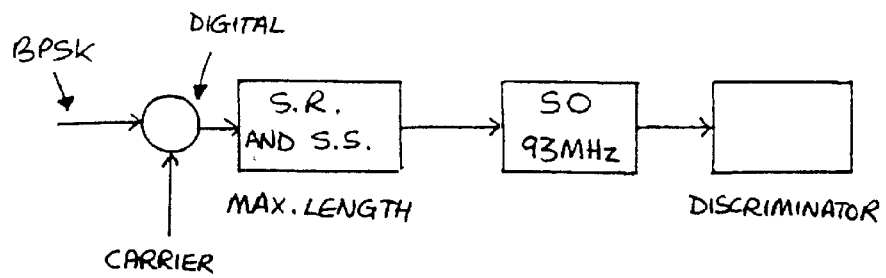
FIG. 34 illustrates an example BPSK receiver described in Annex A.

A BPSK receiver for the circuit in FIG. 33, is shown in FIG. 34. The input from the antenna and the DMB is applied to a receiving SO. The SO is followed by a Max. Length Shift register, the same type, as in the transmitter to extract the original PPM information. The PPM information in the form of audio, video or digital is applied to a discriminator. The discriminator demodulates these information, whether in audio, video or digital, in their useful information format.

SO and SO/NIC provide the best form of detection without distortion and high energy efficiency. FIGS. 33 and 34 are ideal transmitting and receiving systems for all kind of portable or non-portable communication systems, in direct sequence SS.

Feature 5

Simple FM Transmitter/Receiver

Figure 35:
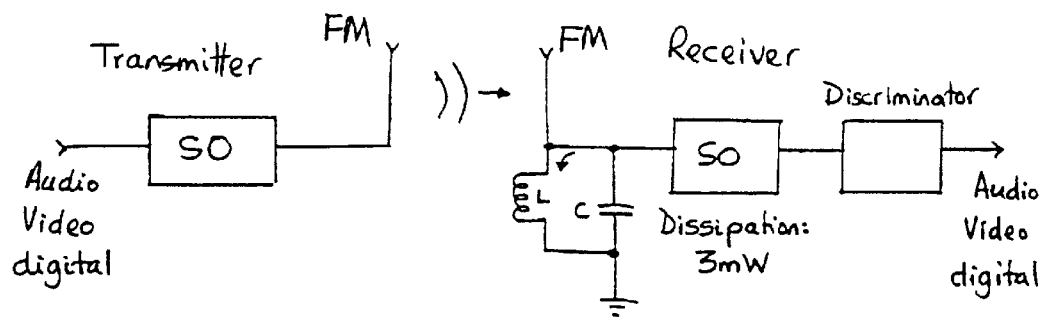
FIG. 35 illustrates an example of a simple efficient SO Transmitter/Receiver described in Annex A.

FIG. 35 shows the block diagram of a simple, but very energy efficient and powerful Transmitter/Receiver, using only SOs or NIC/SOs. The information on audio, video and digital are applied to the SO that provides FM, for all cases. The SO, in this case, can handle up to 1 Watt output.

The FM information is received by another SO, at the receiver, in slightly different structure. The output of the SO is applied to a discriminator, which converts all inputs to their useful format.

The output of the discriminator provides positive output for higher frequencies or vice versa, while no frequency change provides zero output. The output of the discriminator may be equipped with a simple pulse forming network.

The SO or the NIC/SO can detect signals as low as −100 dBm, while, for example, a PLL can detect signals not lower than −25 dBm. Also the SO can detect signals with very high noise level, such as −40 dB, while a PLL can detect signals only at +3 dB.

Also, the SO or NIC/SO provides wider transmission coverage area, for the same energy than other transmitters. In short the SO or NIC/SO eliminates the poor receiving properties of present day cellular phones and provides wider coverage area.

Feature 6

Biological Energy Efficiency

Biological Energy Efficiency is generated by almost all kind of SOs. This is possible because SO and CPSO have very close correlation with biology. The process by which this happens is as follows:

The energy supplied by the input to the SO is very small, in the order of −2 dBm and −100 dBm.

This small energy ensures that the input signal does not disturb the oscillations and likewise the internal regeneration gain is high enough not to be disturbed by input signal level.

When the positive feedback and the input signal, combined, enter the SO, they become part of the regeneration process, without disturbing the oscillations.

Due to internal regeneration process the input signal is amplified and as soon as it reaches the amplitude of oscillations, it replaces the original oscillations. A 10 $\mu$V input signal is amplified to 5 volts, by the internal regeneration energy process. The input signal is used only to extend the tracking range.

Figure 36:
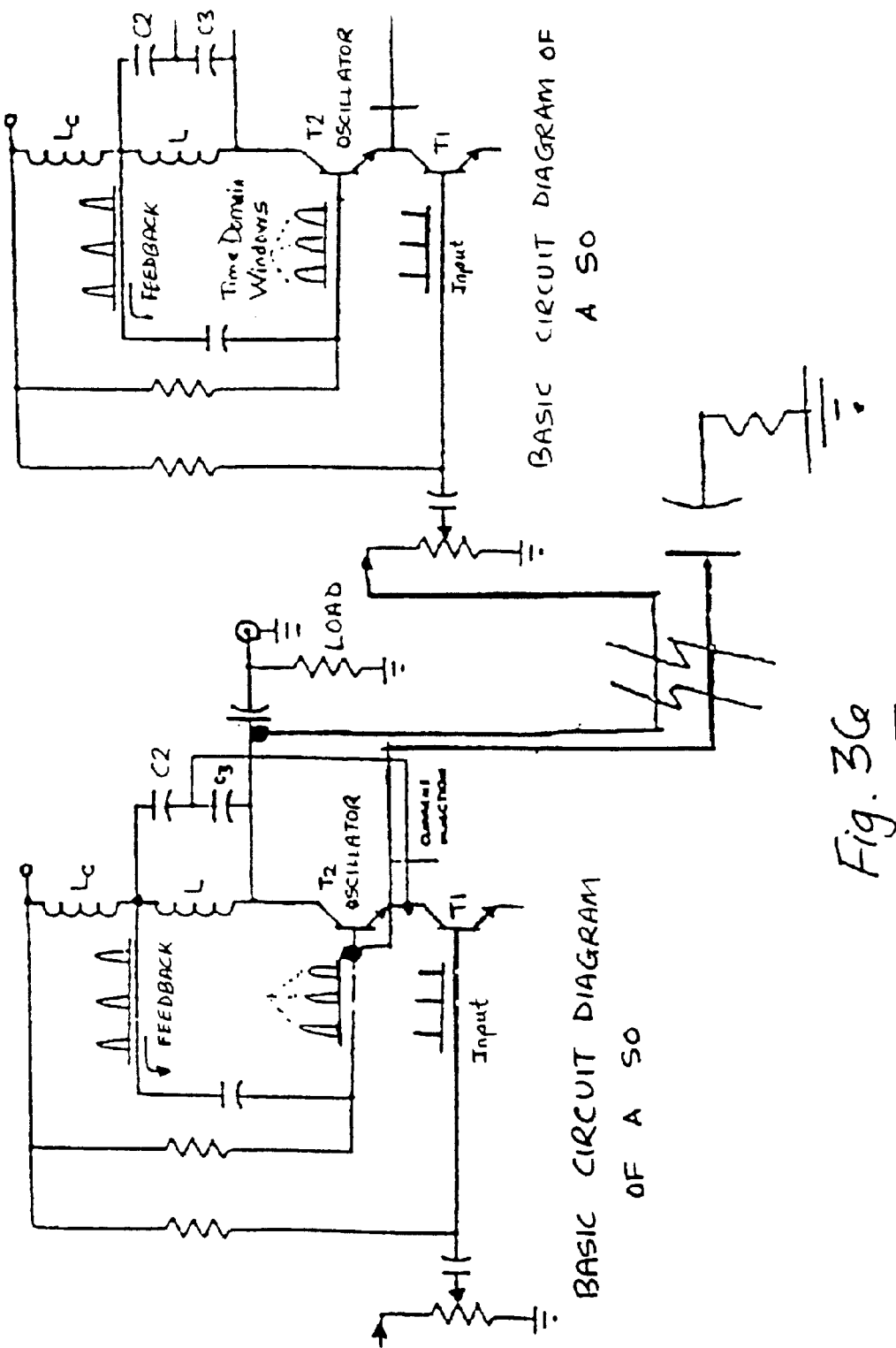
FIG. 36 illustrates an example of NIC through line capacitors described in Annex A.

This action is similar to an approach to perpetual motion, because still there is energy dissipated in the oscillator circuit, mostly by the transistor biasing networks. This dissipation can be reduced by using negative resistance devices, such as Tunnel or Esaki diodes. This high energy efficiency can be further boosted by the Negative Impedance Inversion. The connection of a series inductive + capacitive network in the collector to base feedback path, as shown in FIGS. 28 and 29, provide the NIC. FIG. 29 uses only a single capacitance to provide the NIC. Many SO/NIC networks were used to boost the energy efficiency, dumping energy into the systems. This additional energy can be used in transmission lines to improve the overall performance, in noise rejection, stability and jitter, as well as it increases the frequency of operation. FIG. 36 shows the operation of such a transmission line between two NIC SOs where the NIC is provided by the distributed line capacitor.

A NIC circuit, designed for 140 MHz were used in 560 MHz, QPSK carrier recovery networks. They have been used also in PLLs, at various frequencies. A circuit diagram of a SO/NIC, with components values, is shown in FIG. 30. Another important application area is in the manufacturing of microelectronic chips. By designing to the SO a circuit providing NIC, the chip functional performance will improve, its frequency will increase, the frequency will be more stable and jitter will be lower.

Although, NIC provides improvements in SO performances, the fundamental; functional properties of SO are geared up for optimum performances. For example, the presence of three internal filters, is property that does not exist in any classical network. This provides a high noise rejection, independent of its wide data BW. Also, the inverse proportionality of SO regeneration gain and input signal sensitivity to the input signal level, makes it possible to detect the smallest possible input signal under high noise, independent of data BW. The SO and the CPSO work similar to a spectrum analyzer. The SO looks at any time to the instantaneous or noise bandwidth and its immediate surrounding frequencies to track the entire data. It is believed that sharks and dolphins communicate with the same techniques as a SO. Knowing the difficulties associated with under-water communications, the two or the three filter technique is the only way to provide high noise rejection with wideband data.

This technique can be used also in building high speed computer.

The Self-Regulation and Maxwell's Dissipation Criteria

The Self-Regulation process is one of the universal laws that govern our universe, biological and human presence and provides the connection between biology and the Synchronous Oscillator (SO). Other common functional properties which are common are the clock, synchronization and the energy efficiency. FIG. 24 shows the tracking range or data bandwidth of a Synchronous Oscillator, that is generated by the self-regulation property of the SO, that is the regeneration gain X amplitude of Oscillations=Constant. This self-regulation prevents the SO from self-destruction. Van der Pol [1,2] assumed that an LC oscillator generates saturation that leads to self-destruction. An LC oscillator does not saturate, but provides a self-regulation. Saturation is accumulative and positive feedback continuously feeds back the saturation that accelerates the destruction. Like all biological existence and nature the oscillator is self-regulated as indicated in the generation of the tracking range. Maxwell's criteria is very clear and works universally. Saturation decreases the energy efficiency, generates distortion and distortion dissipates more power and the efficiency of the SO constantly decrease to lead to self-destruction. Of course this does not happen. Self-regulation is a controlling factor to provide a smooth operation for SO, with flat and wide tracking range, and abrupt transition corners.

We don't see people 20 or 30 feet tall, nor trees reaching the skies, nor the fish population in a pond, increases indefinitely, big fish eating small ones. Likewise, the SO is protected by self-regulation, providing also wide and flat tracking range or data BW. This operation is only possible by self-regulation. This is a correction that must be taken very seriously, because all nature works under this criteria. Only under self-regulation the wide and flat tracking range or data bandwidth is possible. Any distortion with the oscillator would distort the tracking range and flat tracking range cannot exist.

Role of Phase in Communications
A New Powerful Technique in Detection

Phase plays an important role in the detection of Weak and noisy signals. In high speed communications phase degrades the receiver performance by several dB. In order to eliminate the phase degradation I invented the Coherent Phase-Locked Synchronous Oscillator (CPSO) (Electronic Letters, Sep. 25, 1986, pp. 1060–1061). The CPSO improved the BER of communication systems by several dB, by providing zero phase error between input and output. The CPSO has a feedback and a feedforward loop that slow down the phase correction, similar to the loop behaviour in PLLs. Also, it makes the circuit bulky and the design critical. The CPSO has all the features of a SO, as far as frequency is concerned.

The present technique uses an improved version of SO(ISO), by making use of Negative Impedance Conversion (NIC) and the parametric action in the base-emitter junction capacitor of the oscillator transistor, both covered in the recent patent application, Oct. 7, 1999, by STERNE, KESSLER, GOLDSTEIN & FOX P.L.L.C. Appl. Ser. No. 60/158,031.

In the ISO phase information is changed, by the SO, to Frequency Modulation (FM). The FM can be demodulated by a frequency discriminator. Phase information is associated with the FM, where abrupt changes in frequency denote abrupt changes in phase.

The ISO makes full use of SO performance, where the input signal becomes part of the internal regeneration gain, that further amplifies and filters the input signal, to improve the detection of weak signals, under high noise. To this performance we add also, the parametric action, associated with SO, that changes rapidly the input signal information into FM. Experiments have shown that parametric action is more effective, if the incoming information is Amplitude Modulated (AM), as expected, the input signal sensitivity is further improved by the NIC, covered in the recent patent.

The ISO can be used to detect air-pockets, while the airplane is in flight. The ISO eliminates complicated circuits and high power radars in detecting the air-pockets. The design and use of ISO circuits in radars will make it possible to use simple radars in the detection of air-pockets. When an electromagnetic signal enters an air pocket, there is an abrupt change in phase, that is reflected to rapid frequency variations in FM. This new technique will improve further the quality of broadband, spread spectrum, communications, the performance in data conversion and the performance of control systems, covered in the new patent application.

The standard SOs and CPSOs are used in many areas, such as in Intelsat modems, in IBM computer communication modems, an optical synchronization and amplification, in direct sequence, BPSK and QPSK communications, to mention few. The ISO can be used in any radar to improve detection and provide detection to low level and noisy input signals, that is not possible by other means.

The ISO and the SO are energy efficient networks, because of their close association with biological performance.

Feature 7
Low Power On-Board Radar to Detect Air Pockets in Flight

The Synchronous Oscillator (SO) and the Coherent Phase Locked Synchronous Oscillator (CPSO) have very high input signal and input signal-to-noise ratio sensitivity, −100 dBm and −40 dB respectively, without any input signal matching nor any antenna gain. The input signal sensitivity of radars can be improved by using SO or CPSO with NIC.

The SO and CPSO eliminate the use of high power radars to detect air pockets in flight. The high input signal sensitivity is provided by using SO/NIC or by using CPSO/NIC. CPSO/NIC can provide −150 dBm input signal sensitivity, with zero phase detection capability. The high input signal sensitivity replaces high power radars, that can not easily be placed on planes.

Feature 8
Approach to Perpetual Motion

Figure 37:
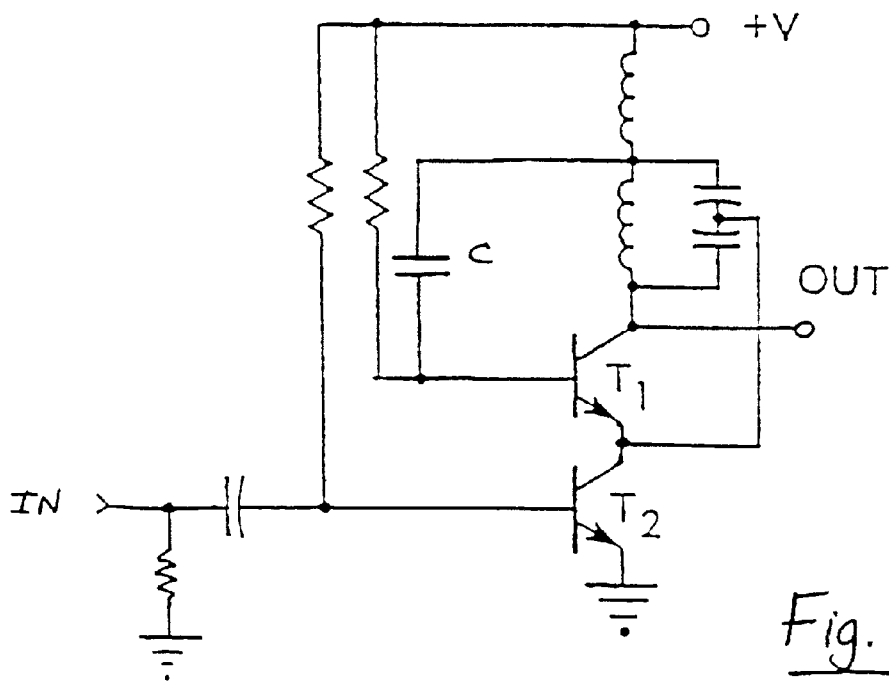
FIGS. 37 and 38 are schematic drawings illustrating SO principles described in Annex A.
Figure 38:
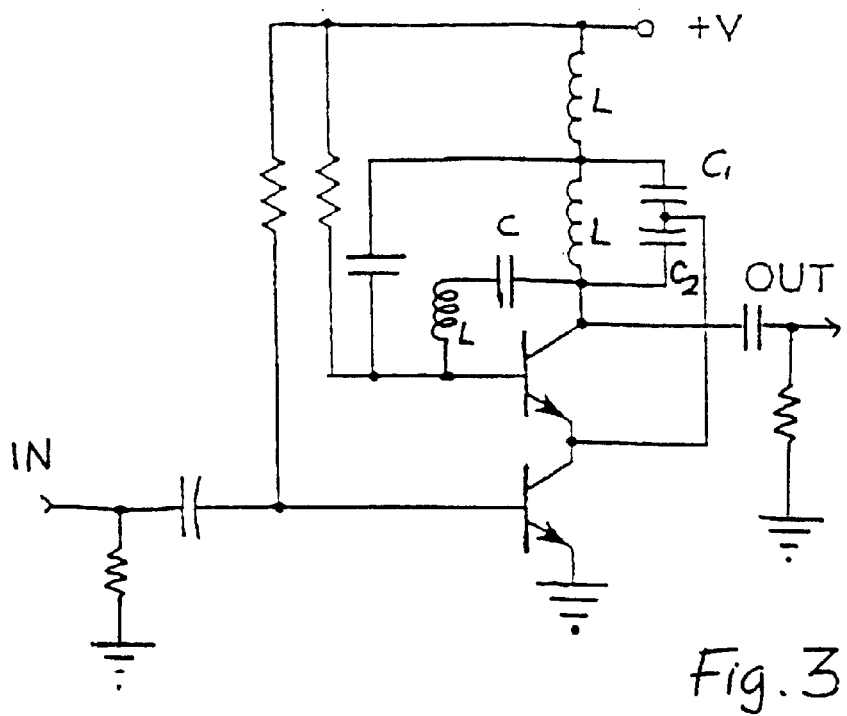

The circuit shown in FIG. 37 is a standard Synchronous Oscillator (SO). It has a positive feedback through capacitor 'C', which sustain the oscillations. To this circuit we add a LC network L1 and L2, from the collector of T1 to the base of T1, as shown in FIG. 38. In U.S. patent application, Oct. 11, 1999, Appl. Ser. No. 60/158,031, this network was identified as NIC/SO. In non-oscillatory circuits this feedback is considered a negative feedback.

There is no perfect sinusoidal wave. Up to 3–4% distortion in a sinusoidal waveform cannot be seen on oscilloscope. The SO takes the output through L1 and L2 and feeds back to SO at the base. At the same time also the feedback through "C", is applied to the base of the oscillator transistor T1. Both of these waveforms reach the base-emitter junction of T1. The non-linear base-emitter junction acting as a mixer, extracts the distortion associated in the oscillator waveform provides synchronization to the existing oscillations, that is a harmonic of the original frequency, because the distortion occurs due to the presence of harmonics. It changes the frequency to the harmonic frequency. At the same time the distortion in the SO increases the energy efficiency, improves the functional performance, improves further the frequency stability and phase jitter. The distortion in the sine wave, a lost energy is used to improve the functional performance of the SO, by improving the energy efficiency.

MAXWELL defines energy efficiency by distortion, which generates dissipation and reduces the energy efficiency. I take this lost energy to provide additional improvements in the energy efficiency and functional properties of the SO, without using any external energy. The input signal which exists eliminated by the fact that the SO has higher regeneration gain for lower signals. The extracted harmonic has lower energy level than the input signal, and takes over the input signal which has higher signal level at the input to the base of the oscillator transistor T1.

We know that we cannot provide perpetual motion machine, but we provide a system that approaches perpetual motion machine. I have performed this task and built several SO units to prove the case.

This is one of the paradoxical performances of the SO. SO works on the principles of biology.

Feature 9
The Synchronous Oscillator as a TDMA

The Synchronous Oscillator (SO) performs also as a Time Division Multiple Access (TDMA). The SO performs TDMA in an automatic way. The TDMA scans the receiver to find the required information or number. In SO the SO itself is synchronized to the incoming frequency and it is very fast action. The SO is designed not only for high input signal sensitivity, it is also designed for a required bandwidth. The bandwidth or tracking range can be as much as 16 MHz while the noise rejection can be as low as few hundred Hz. The SO has three internal filters, two noise rejection filters and the summation of all the noise rejection or instantaneous filter generate the data bandwidth or tracking range. Therefore, the SO does not need a separate TDMA system to cover all memorized numbers.

Feature 10

Figure 39:
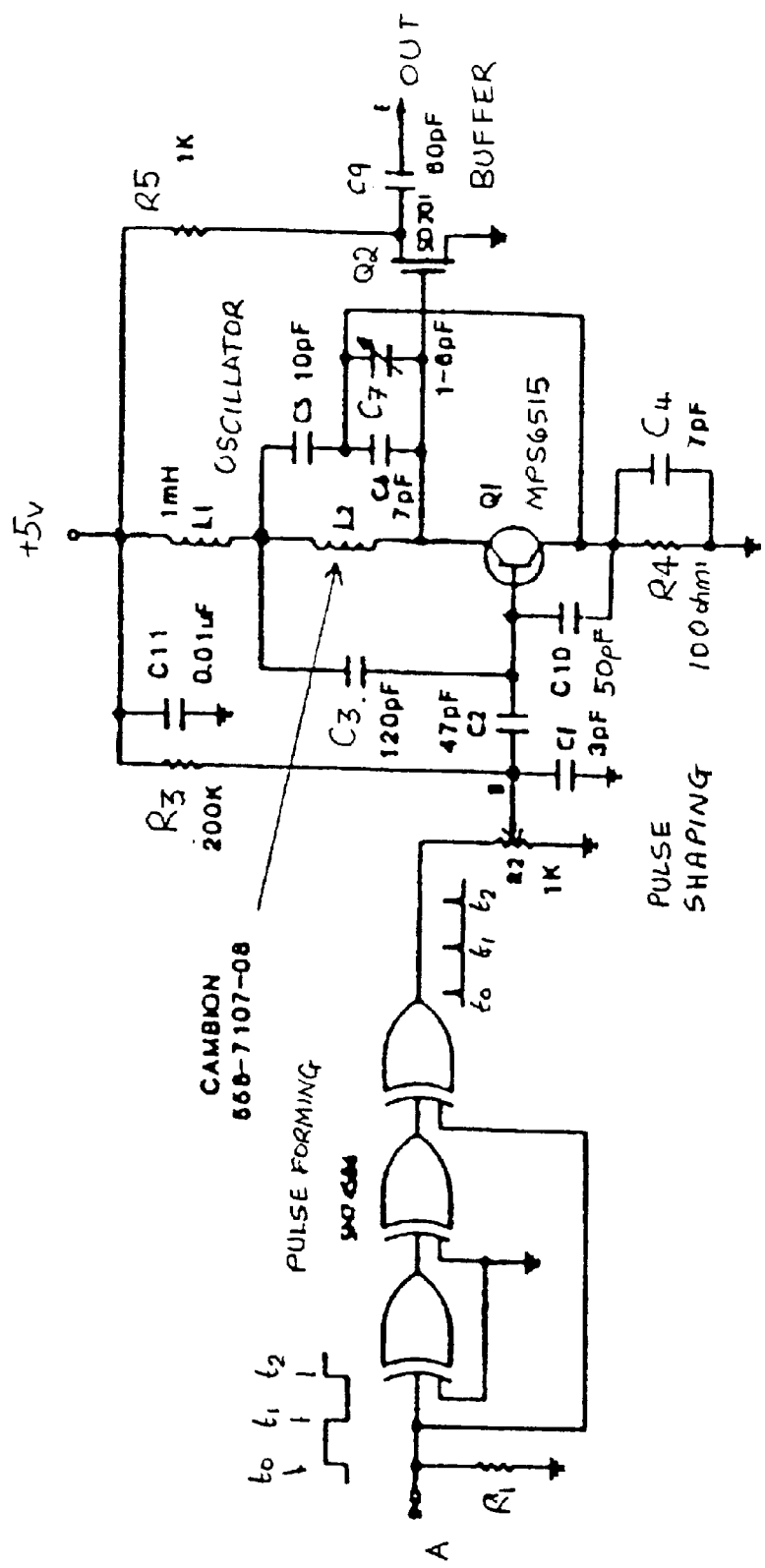
FIG. 39 illustrates an example clock recovery network described in Annex A.

Clock Recovery is the most important parameter in the synchronization process. A circuit diagram of it is shown in FIG. 39.

When input is applied to the input of the Exclusive or Gates a narrow pulse is developed at the input of the transistor MPS6515, that synchronizes the SO. In this case the SO is a single transistor. When the input frequency to the SO increases the frequency of oscillations increases, while when the input frequency decreases the frequency slows down.

Such a clock recovery is working at the IBM Computer Communications Link Modem, since 1979. At the output of the SO there is a MOSFET transistor SC30, to block the output of the SO, from the outside variations.

Feature 11
SO in Portable Telephones

Figure 40:
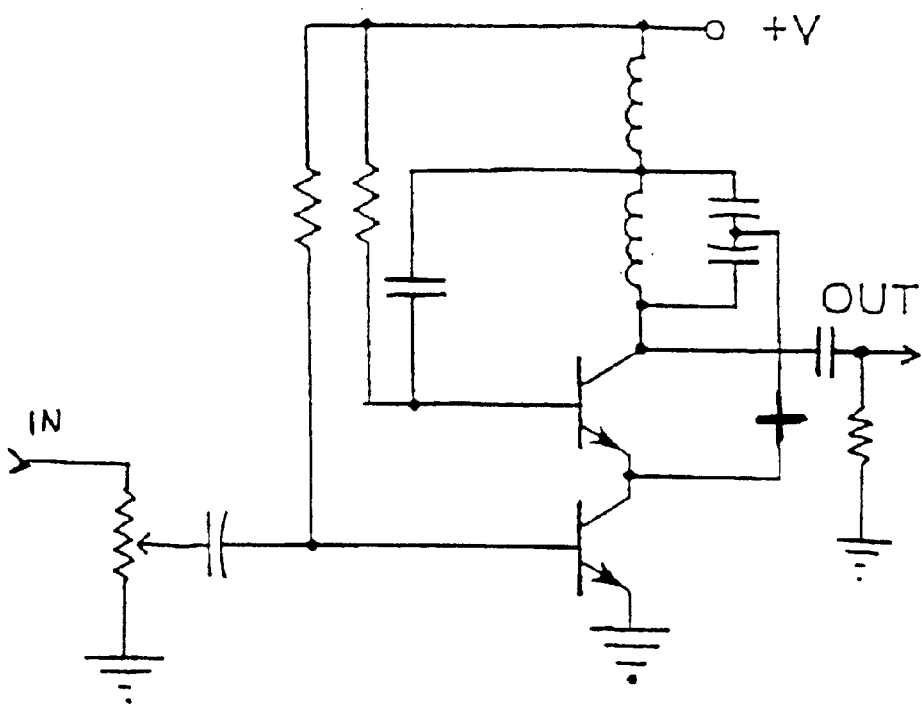
FIG. 40 illustrates an example of an SO inserted at the output of an UP-converter described in Annex A.
Figure 41:
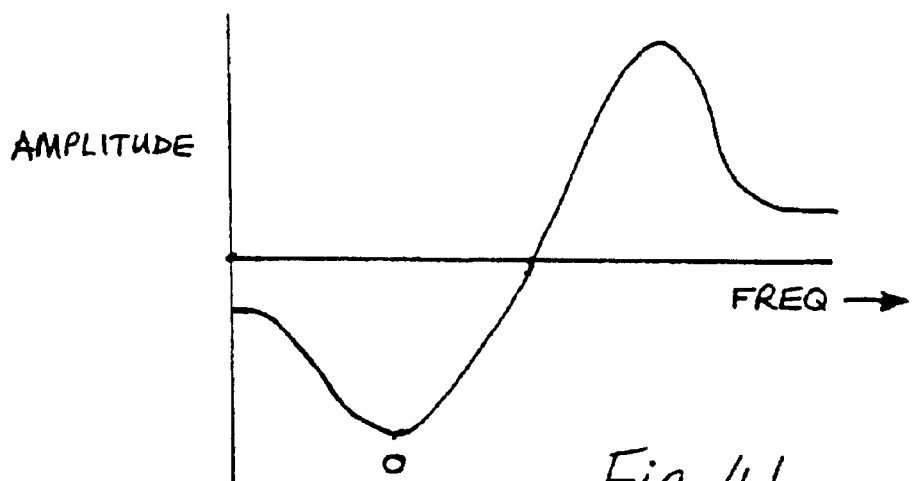
FIG. 41 illustrates an example output of a discriminator for FIG. 40.

FIG. 40 shows such a SO, where the recovered input to the network is applied to the SO, to amplify the input signal. The output of the SO is applied to an FM discriminator. The output of the discriminator behaves as shown in FIG. 41, which can be converted to a digital output. The minus sign is identified as zero level, while the positive output is identified as ONE at the output of the discriminator. A minor circuit is added to the output to the Discriminator to provide such changes.

Feature 12
Routers

Routers are used in the transmission of signals by directing its final destination.

In this case the synchronizers (Synchronous Oscillators) or (the Coherent Phase Locked Synchronous Oscillators) are used and synchronized to the basic clock network of the system or any other media.

Feature 13
Optical Synchronization

Optical Synchronization is achieved by Synchronous Oscillator changing the media of operation to optical signals. For example, an optical media has replaced the electrical media by adding a photo-diode to the optical media excitation. Such circuits have been used for Novel Research Job (designer Vasil Uzunoglu).

Feature 14
HDTV

High Definition TV can use a Synchronous Oscillator for synchronization of signals in wideband communication systems.

Feature 15
Wideband Communication Systems

Synchronous Oscillator is used also in wideband communication systems, without any limitations in frequency, data and phase information.

Feature 16
Improving the Energy Efficiency of a Car

Figure 42:
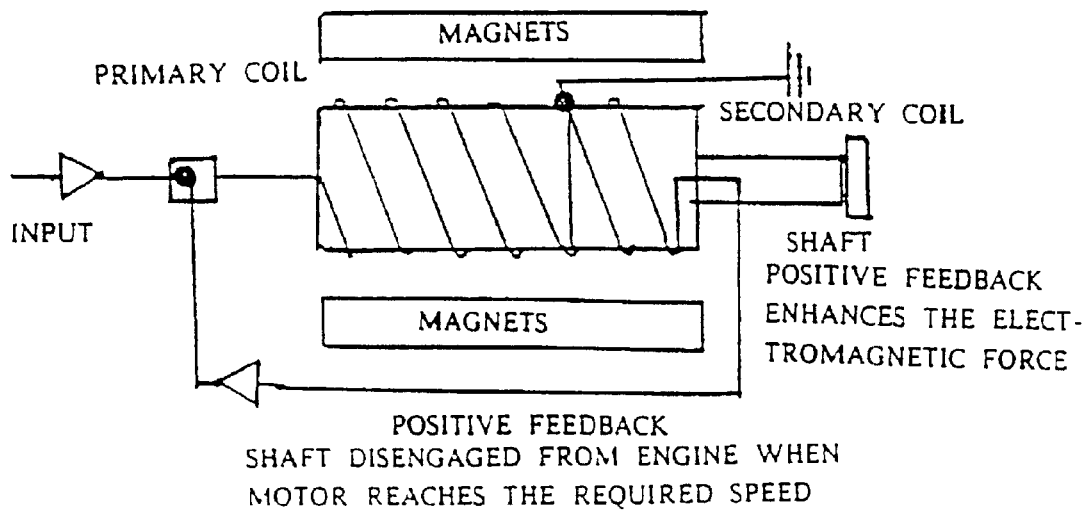
FIG. 42 illustrates an example of SO principles applied to a vehicle motor described in Annex A.

FIG. 42 shows an energy efficient electric motor wiring diagram that will be used as a starting motor in gasoline cars. The synchronous oscillator and the efficient car engine electrical motor have the same principles of operation. An approach to biological efficiency lies in the input signal becoming part of the oscillations or regeneration process, which is similar to the operation of the synchronous oscillator.

The inefficient part of a car is in the period of starting and acceleration, where most of the gas consumption occurs. If at the starting of a car, the gasoline starter is replaced with an efficient electrical motor, or a fully efficient electronic network, the car engine efficiency will improve to a great extent. Most of the gas consumption occurs during the start and the acceleration period of the engine, where the electrical motor will be providing the energy efficiency. If the electrical motor has a secondary winding that is fed back to the input of the main winding of the electrical motor, the car engine will operate exactly like a SO. The secondary winding must provide a positive feedback. This is why the winding of the secondary coil on the motor is important. Thus, when the low level input signal enters the motor, it is amplified due to the regeneration process, induced by the positive feedback, within the motor main winding. A small input to the motor becomes amplified, similar to the SO and the motor can provide the necessary acceleration very efficiently. Both, the SO and the energy efficient car engine block diagram have the same principle of operation. A small input to the motor is amplified, like the case in a SO. Therefore, the car starting mechanism and the acceleration process act exactly like the operation of a SO.

The electrical motor can be replaced also by a SO that will make the car starting and acceleration process fully electronic. A transformer can be placed at the output of SO to boost the voltage or power level.

Feature 17

Paradoxes in SO

The presence of three filters internal to the SO is a very powerful tool in networks, in network design, in the field of communications and the entire electronics technology. The Self-Regulation presents another powerful tool that provides with the association of SO and the CPSO an optimum performance, with high energy efficiency. Still, another powerful tool is the inverse proportionality of the regeneration gain and the input signal sensitivity to the input signal level. This property of the SO and the CPSO reveals an important functional property that has been overlooked for very long time. This powerful property, may be the most unique one, is established by the presence of negative feedback in connection with positive feedback. In the presence of positive feedback, a signal input, that has 180° phase difference from the positive feedback, when applied to SO or CPSO, generates a paradoxy, when the input signal becomes part of the existing regeneration process. The input signal must be below –2 dBm, so that it does not disturb the existing oscillations. This paradoxy is responsible for the high energy efficiency of the SO, when performing a function. Still, the two transistors associated with the SO have dissipation that can be reduced, using negative resistance devices, such as Tunnel diodes or Esaki diodes.

Figure 43:
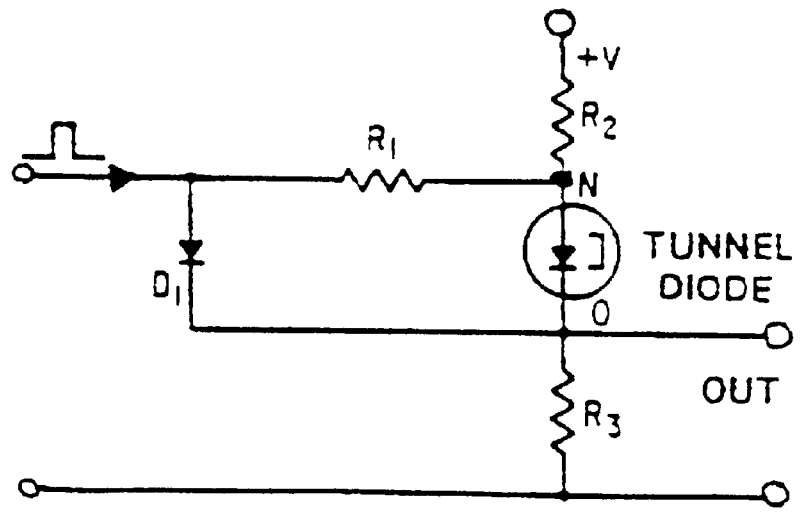
FIG. 43 illustrates an example of a Tunnel Diode Circuit described in Annex A.
Figure 44:
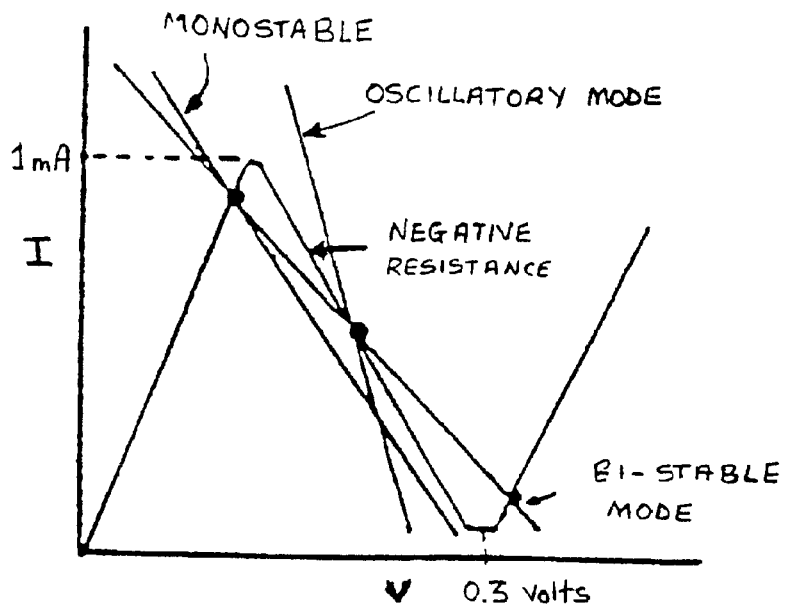
FIG. 44 illustrates an example of Tunnel Diode Biasing described in Annex A.

A Tunnel diode circuit diagram is shown in FIG. 43 and its V-I characteristics and its operational features, in FIG. 44.

References

1. Vasil Uzunoglu, U.S. Pat. Nos. 4,335,404, 4,274,067, 4,356,456, on SOs.
2. Vasil Uzunoglu, Marvin H. White, "Synchronous Oscillator and Coherent Phase-Locked Synchronous Oscillator: New Techniques in Synchronization and Tracking", IEEE Trans. on Circuits and Systems, Vol. 36, No.7, 1989, pp. 997–1024.
3. Vasil Uzunoglu, Marvin H. White, "The Synchronous Oscillator as a Synchronization and Tracking Network", IEEE Journal Solid State Circuits, pp. 1214–1226, December 1985.
4. R. D. Esman "Microwave Subcarrier and Clock Recovery on Optically injected Coherent Phase-Locked Synchronous Oscillator", IEEE Photonic Letters, Vol. 3, No.2, February 1991.
5. André Kesteloot, "A Direct Sequence Spread Spectrum UHF Direct Link", QST, May 1989.
6. T. Flamouropoulos et al., "Recent Developments in Synchronization and Tracking with Synchronous Oscillators", Proc. of the 39th Annual Symposium on Frequency Control, June 1985.
7. Vasil Uzunoglu, "The Regenerative Receiver and the Synchronous Oscillator", Pro. IEEE, Vol. 75, No.10, October 1987, pp. 1437.
8. Vasil Uzunoglu, "Coherent Phase-Locked Synchronous Oscillator", Electronic Letters, Sep. 25, 1986, Vol. 22.
9. Vasil Uzunoglu, Marvin H. White, "Coherent Phase-Locked Synchronous Oscillator-Graphical Design", IEEE Trans. on Circuits and Systems, Vol. 40, January 1993.
10. Zhigang Ma, Marvin H. White, "A High Performance Coherent Phase-Locked Synchronous Oscillator", 35th Midwest Symposium on Circuits and Systems, August 9–12, 1992.

The full text of each of these documents is incorporated herein by reference as if reproduced in full below.

Functions and Functional Properties of SO

The SO can Perform the Following Functions

Synchronization by as low as –100 dBm input signal level.

Tracking, by several MHz, independent of noise rejection.

Amplification by up to 80 dB.

Filtering, by up to 60 dB improvement in signal-to-noise ratio, independent of data BW.

Sampling. No limitation in frequency and bit rate.

Modulation, FM, AM, FSK, PM.

Audio to FM and Video to FM Conversion.

A/D Conversion. No frequency and bit rate limitations.

Division by integer and rational integer numbers, such as ¾, 5/7, ⅛.

Generates direct sequence BPSK and QPSK, directly from AM or FM, without a clock.

Carrier and clock recovery, in digital communications, at any frequency, data BW (tracking range) and noise rejection BW. It is also an ideal PLL network.

In wideband spread spectrum communications networks. No limitations in noise rejection. The SO can have 200 Hz noise rejection filter, while enjoying several MHz tracking range (data BW), at the same time.

In spread spectrum communications within buildings to eliminate reflections.

In optical communications and synchronization.

In radar chronographs to substitute for missing return signals.

Brickwall video amplifiers or filters, with zero phase error, within the BW.

The CPSO performs everything the SO does; in addition it provides coherency.

The SO can perform any number of the above functions, in a single process.

Some Performance Capabilities of SO

The SO has no frequency limitations

The SO is frequency stable

The SO has low phase jitter

The SO can detect signals as low as –100 dBm and signals with noise, as low as –40 dB, the same numbers for a PLL are –25 dBm and +3 dB, respectively.

The SO has three internal filters, that function independent of each other. The SO operates similar to a spectrum analyzer. The resolution BW can be few hundred Hz, while the data BW several MHz wide. The designer can choose any noise BW and any tracking range, without any compromises.

The SO dissipates as low as 3 m Watts. Functionally, the energy efficiency may reach 90%.

The SO can recover signals from noise, where noise power can be ten thousand times more than the signal power.

The SO belongs to a new class of networks, that are called ENERGY FUNCTIONS.

The SO has also self-regulating properties such as

REGENERATION GAIN×AMPLITUDE OF OSCILLATION= CONSTANT

This property of the SO prevents the self-destruction of oscillators and provide also the flat and wide tracking range or data BW.

The second self-regulating property is

REGENERATION GAIN×INPUT SIGNAL LEVEL=CONSTANT

This property provides higher regeneration gain for lower input signal level. This is one of the unique properties of the SO, that distinguishes itself from classical networks.

INPUT SIGNAL LEVEL×INPUT SIGNAL SENSITIVITY=CONSTANT

This property provides higher input signal sensitivity for lower input signal levels. This is why a SO can detect the lowest possible signal levels, without affecting its stability. The SO has also maximization property.

NOISE REJECTION×DATA BW=MAXIMIZED

Maximization property leads to optimization in SO, while in any other field, it leads to self-destruction. The noise rejection and the data BW are optimized simultaneously.

Parametric Performance and Modulation within a Synchronous Oscillator

MANIFESTATIONS OF THE TWO PHENOMENON—THE SYNCHRONIZATION AND THE PARAMETRIC RESONANCE—ARE DIFFERENT IN THE FORMER, THE SYNCHRONIZATION IS GENERATED DIRECTLY BY THE INPUT STIMULUS OR EXCITATION. IN THE LATTER THERE IS NO EXTERNAL STIMULUS. THE PARAMETRIC ACTION IS DUE TO PERIODIC VARIATION OF ONE OF THE PARAMETERS OF THE NETWORK, SUCH AS A JUNCTION CAPACITOR. IN SYNCHRONOUS OSCILLATORS (SOS), PARAMETRIC ACTION, MODULATION PROCESS AND SYNCHRONIZATION OCCUR AT THE SAME TIME.

WHEN AUDIO/VIDEO/or DIGITAL SIGNAL IS APPLIED TO SO, THE FOLLOWING ACTIONS TAKE PLACE.

1. Parametric Action. It converts audio/video/or digital to FM, using the parametric action of the base-emitter junction capacitor.
2. Modulation. The SO frequency is modulated with the FM information to provide $\bar{\omega}_o \pm$audio/video/or digital spectrum SO uses only the upper side band, so that we have $\bar{\omega}_o$ audio/video/or digital spectrum Modulation brings the frequency spectrum of input signals within the range of the SO so that it can be synchronized. When the input to SO is audio, for example, its frequency spectrum is too low for a 100 MHz SO to extend its tracking range. Modulation is performed by the non-linear base-emitter resistance.

3. Synchronization. The FM modulated signal is ready to synchronize the SO. All the three actions, namely, audio/or video/or digital to FM conversion, the modulation process and the synchronization are performed within a fraction of a $\mu$sec with energy efficiency and high functional quality.

Figure 45:
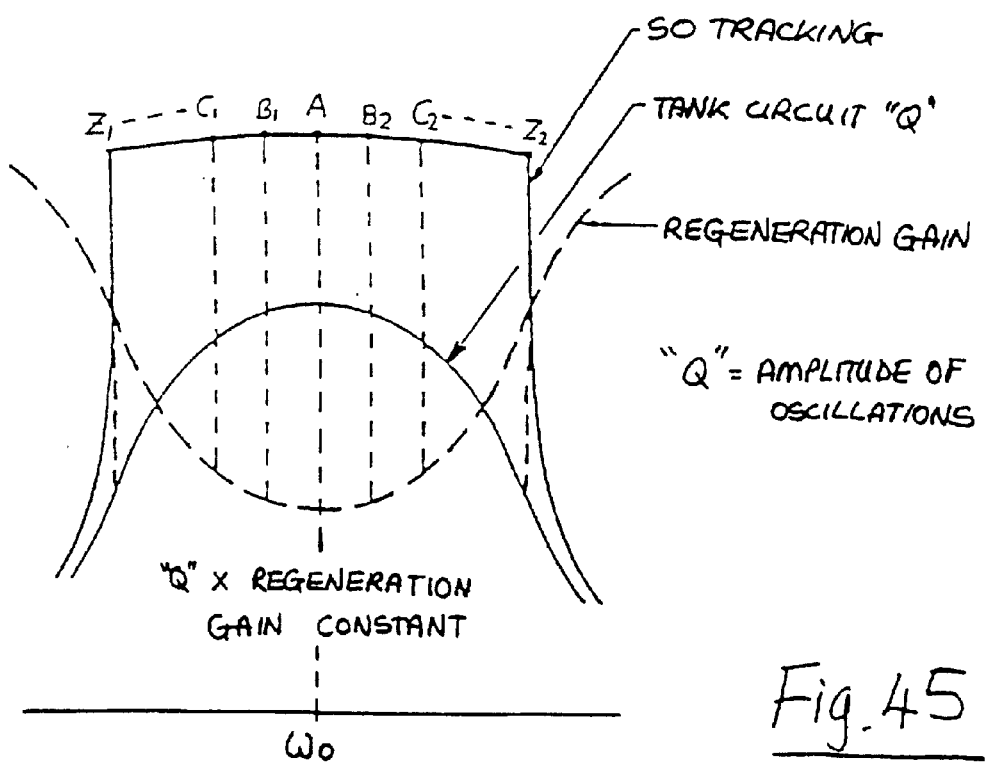
FIG. 45 illustrates an example of Self-Regulation in an SO as described in Annex A

We don't see 20 or 30 feet tall people, nor trees reaching the skies, nor the fish population in a pond increases indefinitely, big fish eating the small ones. A very good Self-Regulation is observed in SO and CPSO. When internal regeneration gain of the SO increases, its amplitude of oscillations decreases to provide protection for survival. Otherwise, continuous positive feedback would lead to self-destruction. FIG. 45 shows the Self-Regulation in action, where two non-linear curves provide a linear tracking range. As a matter of fact only an ensemble of non-linearities can lead to linear performance.

The two curves, namely the regeneration curve and the amplitude of oscillation curve when multiplied, provide the flat and wide tracking range with abrupt transition corners. This happens because of Self-Regulation, otherwise we would have a distorted tracking range. This indicates also the high energy efficiency at which the SO works. In a CPSO the phase curve is also linear.

Four Powerful Functional Properties of Synchronous Oscillators

Figure 1:
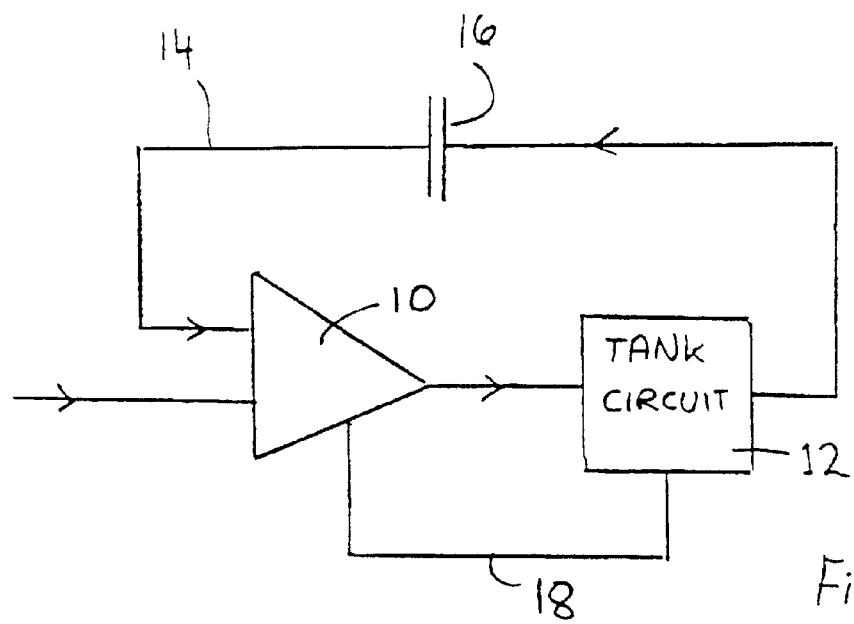
FIG. 1 is a schematic block diagram showing the building blocks of a conventional (prior art) synchronous oscillator.
Figure 2:
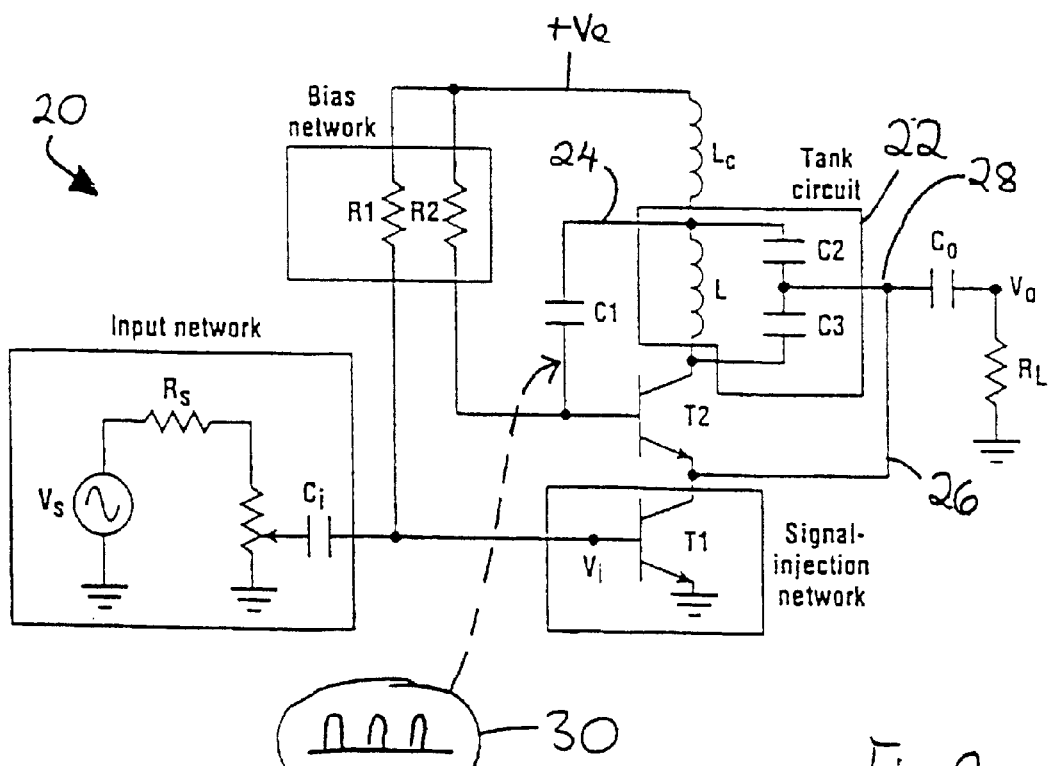
FIG. 2 is a schematic circuit diagram of an example of a conventional (prior art) synchronous oscillator.
Figure 3:
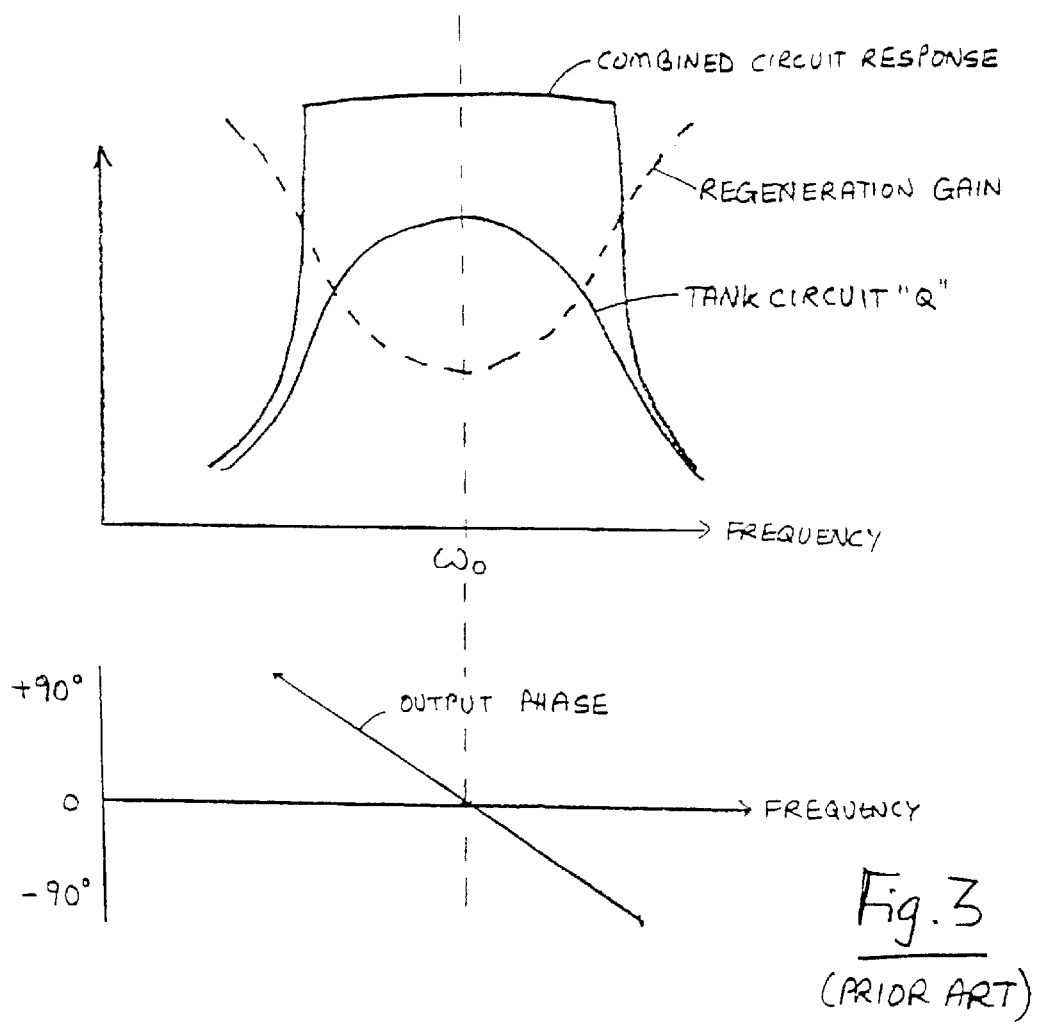
FIG. 3 is a schematic illustration of characteristics of a synchronous oscillator in phase.
Figure 4:
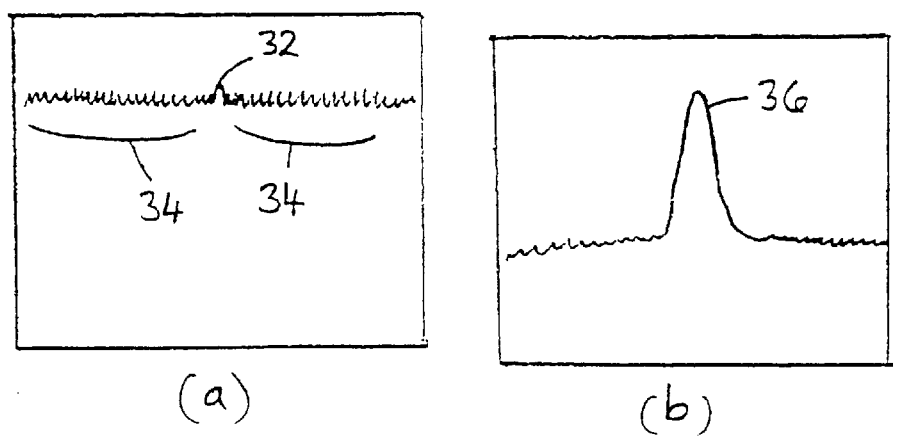
FIG. 4 shows the improvement in signal to noise ratio provided by a synchronous oscillator.
Figure 5:
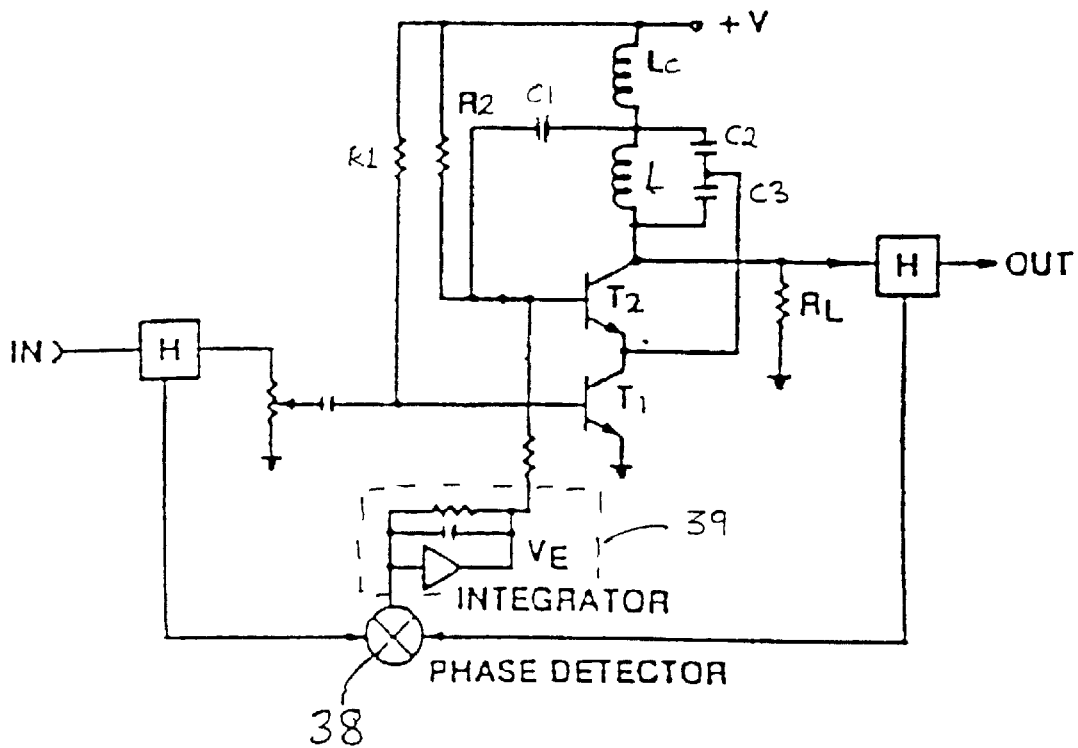
FIG. 5 is a schematic circuit diagram showing a conventional (prior art) coherent phase synchronous oscillator.

1. The Synchronous Oscillator (SO) has three internal filters, that operate, independent of each other. The tank circuit, under regeneration, may have $3 \times 10^6$ or higher 'Q'. The summation of all high 'Q' filters generate the data BW (or tracking range). The high 'Q' filters are called also noise rejection filters or instantaneous filters, because they constantly move back and forth, to generate the data BW. FIG. 1 shows the generation of data BW (or tracking range). The third filter is the sampling filter. This filter is due to class "C" operation of the oscillator. Standard classical networks have only one filter and one BW associated with them. Design with classical networks or filters is a trade off between noise rejection BW and data BW (or tracking range). If noise rejection is improved by narrowing the filter BW, the data handling capacity of the filter decreases. There cannot be a good design with classical networks. Even under moderate noise levels and bandwidth requirements, classical networks don't work. A good example is a PLL. One has to compromise between noise BW and data BW, which is not possible. Compromises don't work and the designer is left with a poor design. PLLs are also slow acting devices because of loop filters and phase detectors.
2. The second powerful property of the SO is the inverse proportionality of the internal regeneration gain and the input signal sensitivity to the input signal level. See FIG. 2. This implies that the regeneration gain and the input signal sensitivity tend to infinity, as the input signal level goes to zero. This is why, the SO can detect signals as low as −100 dBm and signals with S/N as low as −40 dB. The same numbers for PLL, for example, are −25 dBm and +3 dB, respectively. Moreover, the SO can perform 70 dB or higher amplification and 70 dB signal-to-noise ratio improvement in any of its performances, at any signal and noise level.
3. The third powerful property of the SO is the self-regulation. Self regulation is a property that prevents the oscillator from self-destruction and makes it possible for the SO to detect the smallest possible signals. The limitation comes from the thermal noise of network elements. Even the thermal noise is limited, because of the high 'Q' noise rejection filter. The self-regulation is universal phenomenon. We don't see 10 feet or 20 feet tall people nor the fish population in a pond increases indefinitely, big fish eating the small ones. Self-regulation provides also flat and wide tracking range (data BW).

4. The fourth powerful property is the maximization process, where

Noise Rejection×Data $BW$ (or tracking range)=Maximized

In classical networks the above product is constant. Improving noise rejection deteriorates the data BW and vice versa. In SO maximization process leads to optimization. The SO is the only device or network element where maximization leads to optimization, in all other cases maximization leads to self-destruction.

NOTE: Those who work with PLLs know that design with Classical networks never yield a good design, because the same loop filter must satisfy the noise rejection as well as the data BW, a process that is never possible. This is why a PLL never satisfies the design requirements. Moreover, the PLL has low input signal sensitivity. The SO dissipates only few mWatts. The SO is also frequency stable and has low phase jitter, because of high 'Q'.

What is claimed is:

1. A synchronous oscillator comprising:
   an amplifier;
   a first resonant circuit having a first resonant frequency and being coupled to the amplifier to generate regenerative oscillation;
   a feedback path from an output node to an input node of the amplifier, the feedback path comprising a second resonant circuit having a second resonant frequency at least ten times lower than said first resonant frequency.

2. A synchronous oscillator according to claim 1, wherein said second resonant circuit comprises a complex impedance corresponding to a capacitance in series with an inductance.

3. A synchronous oscillator according to claim 1, wherein said second resonant circuit comprises a capacitor in series with an inductor.

4. A synchronous oscillator according to claim 1, wherein said first resonant circuit has a first characteristic capacitance affecting said first resonant frequency, and wherein said second resonant circuit has a second capacitance at least 10 times larger than said first characteristic capacitance.

5. A synchronous oscillator according to claim 4, wherein said first resonant circuit comprises an inductor coupled in parallel with first and second series coupled capacitors, and wherein said first characteristic capacitance is the combined value of said first and second capacitors.

6. A synchronous oscillator according to claim 1, wherein said second resonant circuit has a first characteristic inductance affecting said first resonant frequency, and wherein said second resonant circuit has a second inductance at least 10 times larger than said first characteristic inductance.

7. A synchronous oscillator according to claim 6, wherein said first resonant circuit comprises an inductor coupled in parallel with at least one capacitor, and wherein said first characteristic inductance is the value of said inductor.

8. A synchronous oscillator according to claim 1, wherein said feedback path provides negative impedance conversion.

9. A synchronous oscillator according to claim 1, configured to generate an output at a harmonic of said first resonant frequency.

10. A synchronous oscillator according to claim 9, wherein said harmonic is the second harmonic.

11. A synchronous oscillator according to claim 9, wherein said harmonic is the third harmonic.

12. A synchronous oscillator comprising:
    an amplifier;
    a first resonant circuit having a first capacitance value affecting a resonant frequency of the first resonant circuit;
    a first feedback path coupled from an output of the amplifier through the first resonant circuit to an input of the amplifier, to generate regenerative oscillation;
    a second feedback path coupled from an output of the amplifier to an input of the amplifier, the second feedback path comprising a second capacitance having a value at least ten times greater than said first capacitance value.

13. A synchronous oscillator according to claim 12, wherein said first resonant circuit comprises an inductor coupled in parallel with first and second series coupled capacitors, and wherein said first capacitance is the combined value of said first and second capacitors.

14. A synchronous oscillator according to claim 12, wherein said second feedback path provides negative impedance conversion.

15. A synchronous oscillator comprising:
    an amplifier;
    a first resonant circuit having a first inductance value affecting a resonant frequency of the first resonant circuit;
    a first feedback path coupled from an output of the amplifier through the first resonant circuit to an input of the amplifier, to generate regenerative oscillation;
    a second feedback path coupled from an output of the amplifier to an input of the amplifier, the second feedback path comprising a second inductance having a value at least ten times greater than said first inductance value.

16. A synchronous oscillator according to claim 15, wherein said first resonant circuit comprises an inductor coupled in parallel with at least one capacitor, and wherein said first inductance is the value of said inductor.

17. A synchronous oscillator according to claim 15, wherein said feedback path provides negative impedance conversion.

18. A synchronous oscillator comprising:
    an amplifier;
    a first resonant circuit;
    a first feedback path coupled from an output of the amplifier through the first resonant circuit to an input of the amplifier, to generate regenerative oscillation;
    a second feedback path coupled from an output of the amplifier to an input of the amplifier, the second feedback path having a capacitive, non-inductive characteristic.

19. A synchronous oscillator according to claim 18, wherein said first feedback path comprises a capacitor coupled from a node of said first resonant circuit to an input of said amplifier.

20. A synchronous oscillator comprising:
    an amplifier;
    a resonant circuit coupled in a first feedback path from an output node to an input node of the amplifier, to generate regenerative oscillation; and
    a second feedback path coupled from an output node to an input node of said amplifier, said second feedback path having a complex impedance configured to provide negative impedance conversion for said regenerative oscillation.

* * * * *